(12) United States Patent
Takahashi et al.

(10) Patent No.: US 7,067,961 B2
(45) Date of Patent: Jun. 27, 2006

(54) PIEZOELECTRIC/ELECTROSTRICTIVE FILM DEVICE, AND MANUFACTURING METHOD OF THE DEVICE

(75) Inventors: Nobuo Takahashi, Kasugai (JP); Yuki Bessho, Nishikasugai-gun (JP); Nobuyuki Kobayashi, Owariasahi (JP); Masahiro Murasato, Chita (JP)

(73) Assignee: NGK Insulators, Ltd., Nagoya (JP)

( * ) Notice: Subject to any disclaimer, the term of this patent is extended or adjusted under 35 U.S.C. 154(b) by 239 days.

(21) Appl. No.: 10/615,545

(22) Filed: Jul. 8, 2003

(65) Prior Publication Data

US 2004/0007947 A1    Jan. 15, 2004

Related U.S. Application Data

(60) Provisional application No. 60/395,503, filed on Jul. 12, 2002.

(51) Int. Cl.
*H01L 41/08* (2006.01)
(52) U.S. Cl. ...................... 310/330; 310/324
(58) Field of Classification Search ............ 310/328, 310/324, 330–332
See application file for complete search history.

(56) References Cited

U.S. PATENT DOCUMENTS

| | | | | |
|---|---|---|---|---|
| 4,978,881 A | * | 12/1990 | Wakita et al. | 310/328 |
| 5,376,857 A | * | 12/1994 | Takeuchi et al. | 310/328 |
| 5,381,171 A | * | 1/1995 | Hosono et al. | 347/72 |
| 5,594,292 A | * | 1/1997 | Takeuchi et al. | 310/324 |
| 5,814,920 A | * | 9/1998 | Takeuchi et al. | 310/330 |
| 6,265,811 B1 | * | 7/2001 | Takeuchi et al. | 310/330 |
| 6,478,412 B1 | * | 11/2002 | Hanabata | 347/71 |
| 6,584,660 B1 | * | 7/2003 | Shimogawa et al. | 29/25.35 |

FOREIGN PATENT DOCUMENTS

| | | |
|---|---|---|
| JP | 04-085976 A | 3/1992 |
| JP | 05-124188 A | 5/1993 |
| JP | 06-260694 A | 9/1994 |
| JP | 09-162452 A | 6/1997 |
| JP | 2000-210615 A | 8/2000 |

OTHER PUBLICATIONS

U.S. Appl. No. 10/463,163, filed Jun. 17, 2003, Takahashi et al.

* cited by examiner

Primary Examiner—Mark Budd
(74) Attorney, Agent, or Firm—Burr & Brown

(57) ABSTRACT

There is disclosed a piezoelectric/electrostrictive film device which has a flexural displacement and durability equal to or more than those of a related-art piezoelectric/electrostrictive film device and which has a remarkably high resonance frequency and which is superior in high-speed response. The piezoelectric/electrostrictive film device comprises: a substrate formed of ceramic; and a piezoelectric/electrostrictive operation portion including a lower electrode, piezoelectric/electrostrictive layer, and upper electrode which are successively stacked on the substrate and including a projecting end of the piezoelectric/electrostrictive layer with which an upper surface of the lower electrode and a lower surface of the upper electrode are coated, and a projecting portion of the piezoelectric/electrostrictive layer is a coupling member constituted of a hybrid material in which inorganic particles are scattered in a matrix of a polymer compound, and is coupled to the substrate.

8 Claims, 12 Drawing Sheets

PIEZOELECTRIC/ELECTROSTRICTIVE FILM DEVICE, AND MANUFACTURING METHOD OF THE DEVICE

CROSS REFERENCE TO RELATED APPLICATION

This application claims the benefit of U.S. Provisional Application Ser. No. 60/395,503 filed Jul. 12, 2002, the entirety of which is incorporated herein by reference.

BACKGROUND OF THE INVENTION

1. Field of the Invention

The present invention relates to a piezoelectric/electrostrictive film device, more particularly to a piezoelectric/electrostrictive film device including a structure in which a flexural displacement not less than that of a related-art device is secured, whereas a resonance frequency is high.

2. Description of the Related Art

In recent years, a piezoelectric/electrostrictive film device has been used in various applications such as a displacement control device, solid device motor, ink jet head, relay, switch, shutter, pump, optical modulation device, and fin. The piezoelectric/electrostrictive film device can control a minute displacement, and additionally has superior properties such as high electromechanical transduction efficiency, high-speed response, high durability, and low power consumption. In recent years, in the application of the ink jet head, there has been a demand for a device whose high-speed response is possible in order to enhance printing quality and speed.

Additionally, in general, the piezoelectric/electrostrictive film device includes a structure in which a lower electrode, piezoelectric/electrostrictive layer, and upper electrode are stacked in order on a substrate formed of ceramic. However, in order to secure insulation between the electrodes and avoid dielectric breakdown, as shown in FIG. 19, a piezoelectric/electrostrictive film device 30 has been developed in which an upper surface of a lower electrode 77 is coated with a piezoelectric/electrostrictive layer 73 and an end of the layer projects onto a substrate 44 (See JP-A-6260694).

Moreover, a projecting portion 79 of the piezoelectric/electrostrictive layer can directly be bonded to the substrate 44 formed of alumina. In this structure, since the opposite ends of the piezoelectric/electrostrictive layer 73 are fixed to inhibit the layer from contracting/expanding (the piezoelectric/electrostrictive layer contracts/expands in a vertical direction with respect to a thickness direction by applying a voltage), there is a problem that the flexural displacement is reduced. To solve the problem, in the related-art piezoelectric/electrostrictive film device 30, the projecting portion 79 of the piezoelectric/electrostrictive layer 73 has heretofore been disposed with respect to the substrate 44 in an incompletely coupled state (See JP-A-6-260694).

It is further disclosed that in the related-art piezoelectric/electrostrictive film device 30, to prevent disconnection of an upper electrode 75 by presence of a non-continuous surface generated between the projecting portion 79 of the piezoelectric/electrostrictive layer 73 disposed in the incompletely coupled state, and the substrate 44, a predetermined resin layer is formed between the projecting portion 79 of the piezoelectric/electrostrictive layer 73 and the substrate 44 (See JP-A-6-260694).

However, it has been recognized that in the related-art piezoelectric/electrostrictive device, the flexural displacement or a generative force is adversely influenced by the connection of the projecting portion of the piezoelectric/electrostrictive layer to the substrate. Based on this recognition, enlargement of rigidity of the device has not been considered at all. Therefore, the device cannot necessarily sufficiently meet the demand for the high-speed response in recent years.

That is, in the related-art piezoelectric/electrostrictive devices, almost all the resin layers have a remarkably low hardness as compared with a ceramic or metal material constituting the piezoelectric/electrostrictive layer, and the devices do not substantially contribute to enhancement of the rigidity of the device. In recent years, there has been a demand for a device which has the flexural displacement not less than that of the related-art and also has a high resonance frequency and in which a higher-speed response is possible. This demand has not necessarily sufficiently been satisfied.

Moreover, the resin layer is usually formed by coating a desired portion with a solution containing a resin component and solvent and thereafter drying the solution. However, in a drying step, the resin layer has large shrinkage, and there is a problem that cracks are easily generated in the resin layer, and in the piezoelectric/electrostrictive layer in some cases.

Furthermore, the piezoelectric/electrostrictive film device is requested to be repeatedly driven at a high speed, but the resin layer has a relatively small tenacity, and does not have sufficient resistance to the repeated high-speed driving. Therefore, the obtained piezoelectric/electrostrictive film device has not been necessarily sufficient in durability.

SUMMARY OF THE INVENTION

The present invention has been developed in consideration of the above-described problem, and a first object thereof is to provide a piezoelectric/electrostrictive film device which has a flexural displacement and durability not less than those of a related-art piezoelectric/electrostrictive film device but which obtains a high resonance frequency and which is superior in high-speed response. A second object is to provide a manufacturing method of a piezoelectric/electrostrictive film device, in which the piezoelectric/electrostrictive film device having superior characteristics can be manufactured without cracking or damaging each portion.

The present inventors have made intensive studies in order to solve the above-described problem. As a result, it has been found that when a projecting portion of a piezoelectric/electrostrictive layer is coupled to a substrate by a coupling member constituted of a specific hybrid material, the piezoelectric/electrostrictive film device having a large resonance frequency is obtained without generating any crack in the coupling member or the piezoelectric/electrostrictive layer. Furthermore, the obtained piezoelectric/electrostrictive film, device surprisingly has no drop in the flexural displacement, which has heretofore been considered as a matter of course. It has also been found that the device also has good durability against repeated high-speed driving. This has resulted in a finding that this device can solve the above-described problem, and the present invention has been completed.

That is, according to the present invention, there is provided a piezoelectric/electrostrictive film device comprising a substrate which is formed of ceramic, and a piezoelectric/electrostrictive operation portion including a lower electrode, piezoelectric/electrostrictive layer, and upper electrode which are successively stacked on the substrate and including a projecting end of the piezoelectric/ electrostrictive layer with which an upper surface of the lower electrode and a lower surface of the upper electrode are coated, wherein a projecting portion of the piezoelectric/electrostrictive layer is a coupling member constituted of a hybrid material in which inorganic particles are scattered in a matrix of a polymer compound, and is coupled to the substrate.

Moreover, according to the present invention, there is provided a piezoelectric/electrostrictive film device comprising a substrate which is formed of ceramic, and a piezoelectric/electrostrictive operation portion including a plurality of electrodes and a plurality of piezoelectric/electrostrictive layers which are alternately stacked on the substrate and including a projecting end of each piezoelectric/electrostrictive layer with which upper and lower surfaces of each electrode are coated, wherein a projecting portion of the piezoelectric/electrostrictive layer is a coupling member constituted of a hybrid material in which inorganic particles are scattered in a matrix of a polymer compound, and is coupled to the substrate, and the electrodes are disposed in uppermost and lowermost layers in a multilayered structure of the piezoelectric/electrostrictive layers and electrodes (hereinafter sometimes referred to as "multilayered piezoelectric/electrostrictive film device").

Here, the "projecting portion of the piezoelectric/electrostrictive layer" is a portion in which the lower or upper surface of the piezoelectric/electrostrictive layer does not contact the upper or lower surface of each electrode.

In each piezoelectric/electrostrictive film device of the present invention, the coupling member is preferably constituted of the hybrid material in which silica particles are scattered in the matrix containing polysiloxane polymer as a main component. In this case, polysiloxane polymer in which a substituent group is introduced in a part shown in the following general formula (1).

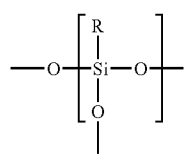

(1)

where R is at least one alkyl group selected from a group consisting of a methyl group, ethyl group, and propyl group, an aryl group, an alkenyl group, or at least one substituent alkyl group selected from a group consisting of a γ-methacryloxypropyl group, γ-glycidoxypropyl group, γ-chloropropyl group, γ-mercaptopropyl group, γ-aminopropyl group, and trifluoromethyl group.

Moreover, an average particle diameter of the inorganic particles is preferably 5 nm to 1 µm, and the particles further preferably have a two-peaks particle size distribution. For the inorganic particles having the two-peaks particle size distribution, a ratio (D/C) of an average particle diameter (C) of large-diameter inorganic particles having a particle diameter larger than that corresponding to an inflection point existing between two peaks to an average particle diameter (D) of small-diameter inorganic particles having a diameter not more than that corresponding to the inflection point is preferably 0.05 to 0.7.

On the other hand, according to the present invention, there is provided a manufacturing method of a piezoelectric/electrostrictive film device in which a piezoelectric/electrostrictive operation portion including a successively stacked lower electrode, piezoelectric/electrostrictive layer, and upper electrode is disposed on a substrate formed of ceramic, the method comprising coating an upper surface of the lower electrode, and a lower surface of the upper electrode with the piezoelectric/electrostrictive layer, projecting an end of the piezoelectric/electrostrictive layer, applying a coating liquid obtained by mixing a polymerizable oligomer and inorganic particles in a dispersing medium between at least the projecting portion of the piezoelectric/electrostrictive layer, and the substrate, and drying the coating liquid to form a coupling member for coupling the projecting portion of the piezoelectric/electrostrictive layer to the substrate.

Moreover, according to the present invention, there is provided a manufacturing method of a piezoelectric/electrostrictive film device in which a plurality of electrodes and a plurality of piezoelectric/electrostrictive layers are alternately stacked on a substrate formed of ceramic to dispose a piezoelectric/electrostrictive operation portion including a multilayered structure, the method comprising coating upper and lower surfaces of each electrode with each piezoelectric/electrostrictive layer, projecting an end of the piezoelectric/electrostrictive layer, applying a coating liquid obtained by mixing a polymerizable oligomer and inorganic particles in a dispersing medium between at least the projecting portion of the piezoelectric/electrostrictive layer, and the substrate, and drying the coating liquid to form a coupling member for coupling the projecting portion of the piezoelectric/electrostrictive layer to the substrate (hereinafter sometimes referred to as "the manufacturing method of the multilayered piezoelectric/electrostrictive film device").

In these manufacturing methods of the present invention, as the coating liquid, a liquid obtained by mixing a siloxane oligomer and silica particles in a polar dispersing medium is preferably used.

Moreover, the average particle diameter of the inorganic particles is preferably 5 nm to 1 µm, and the particles further preferably have a two-peaks particle size distribution. For the inorganic particles having the two-peaks particle size distribution, the ratio (D/C) of the average particle diameter (C) of the large-diameter inorganic particles having the particle diameter larger than that corresponding to the inflection point existing between two peaks to the average particle diameter (D) of the small-diameter inorganic particles having the diameter not more than that corresponding to the inflection point is preferably 0.05 to 0.7.

Moreover, in these manufacturing methods of the present invention, the coating liquid is preferably applied by a spin coating method at a rotation speed of 1500 rpm or more.

Furthermore, in the manufacturing method of the multilayered piezoelectric/electrostrictive film device of the present invention, the plurality of electrodes are preferably disposed in the uppermost and lowermost layers in the multilayered structure of the piezoelectric/electrostrictive layer and electrodes.

DESCRIPTION OF PREFERRED
EMBODIMENTS

Embodiments of a piezoelectric/electrostrictive film device of the present invention will be described hereinafter in detail, but the present invention is not limited to and interpreted by these embodiments. The present invention can variously be changed, modified, and improved based on knowledge of a person skilled in the art without departing from the scope of the present invention.

Figure 1:
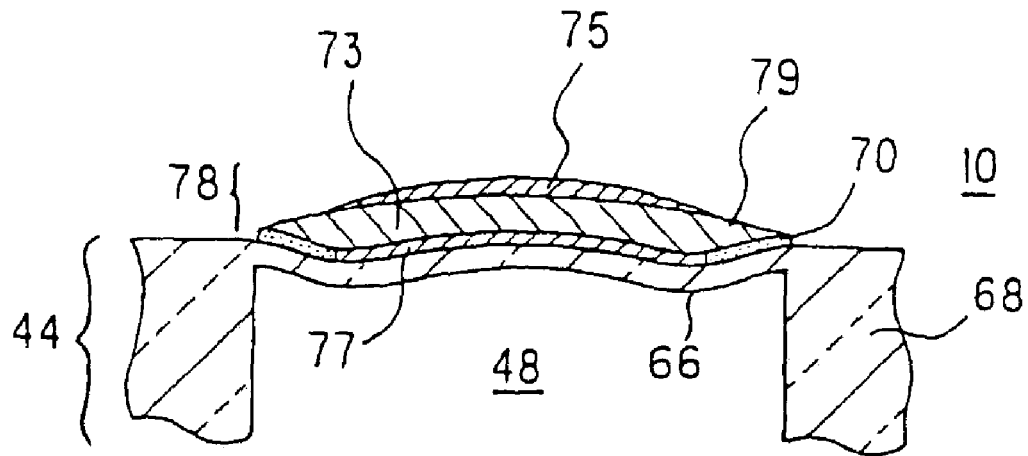
FIG. 1 is a partial sectional view showing one embodiment of the present invention.
Figure 2:
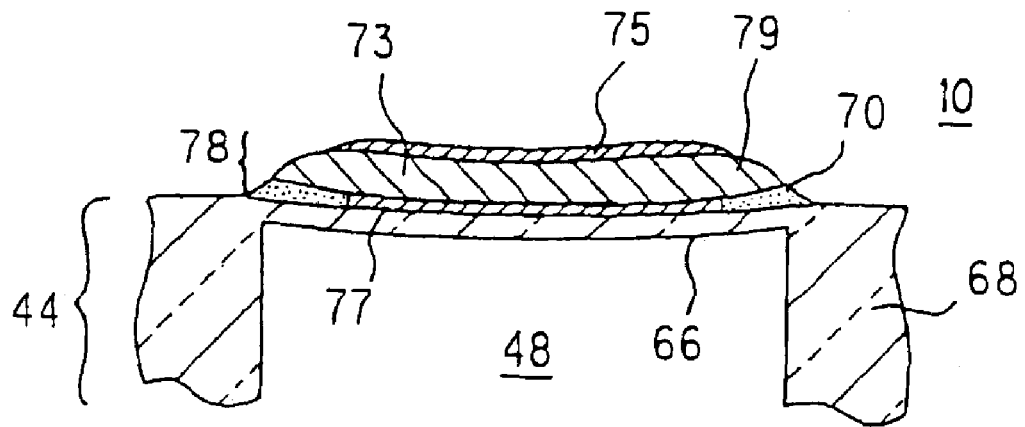
FIG. 2 is a partial sectional view showing another embodiment of the present invention.
Figure 3:
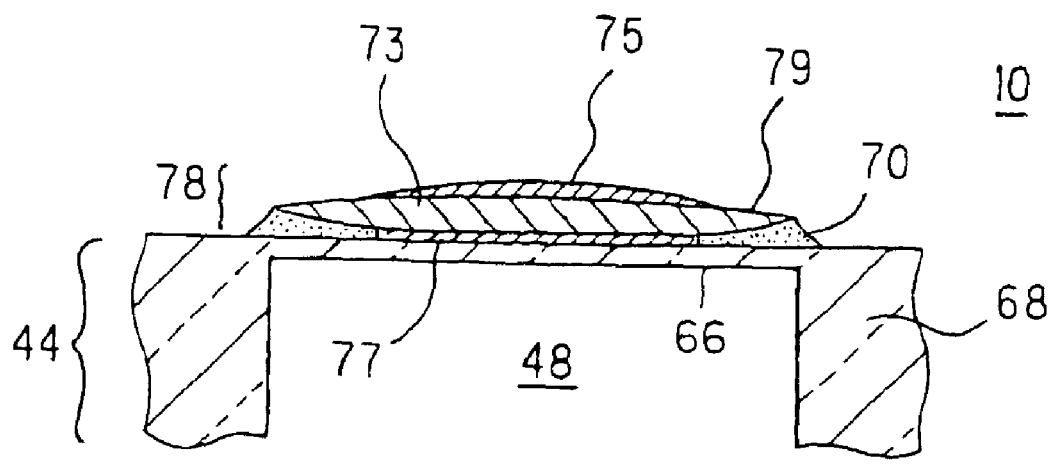
FIG. 3 is a partial sectional view showing still another embodiment of the present invention.
Figure 4:
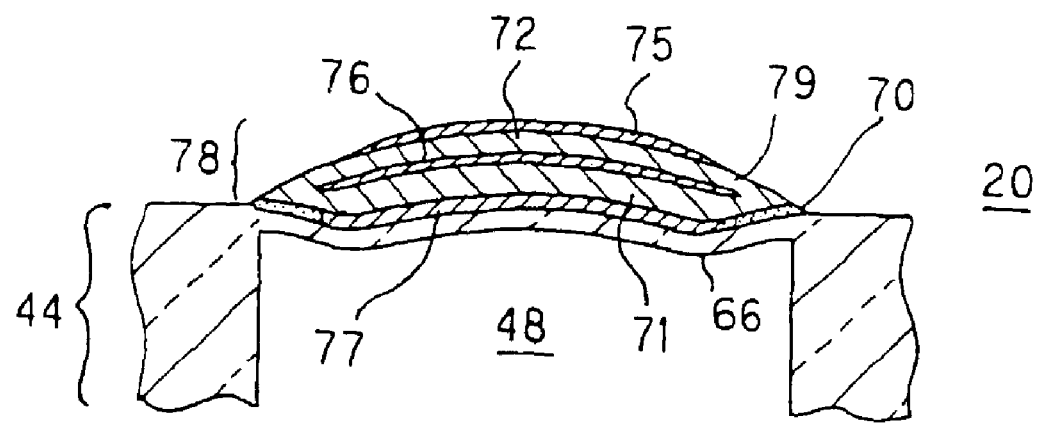
FIG. 4 is a partial sectional view showing one embodiment in a multilayered piezoelectric/electrostrictive film device according to the present invention.
Figure 5:
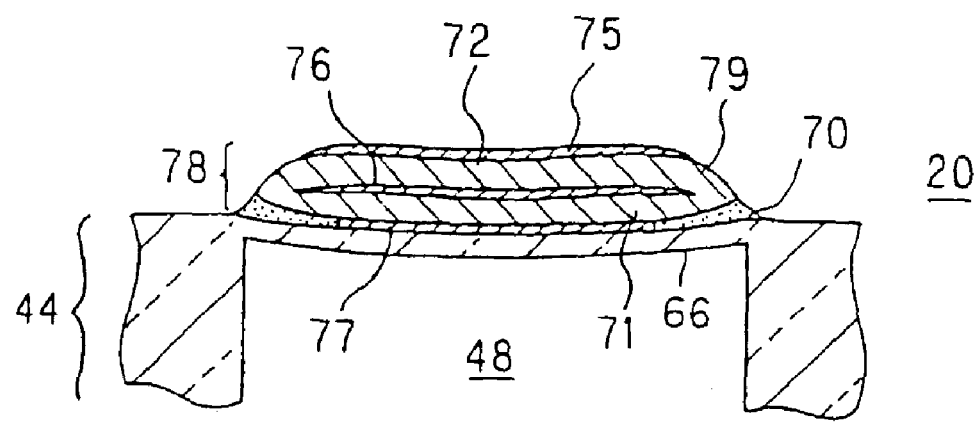
FIG. 5 is a partial sectional view showing another embodiment in the multilayered piezoelectric/electrostrictive film device according to the present invention.
Figure 6:
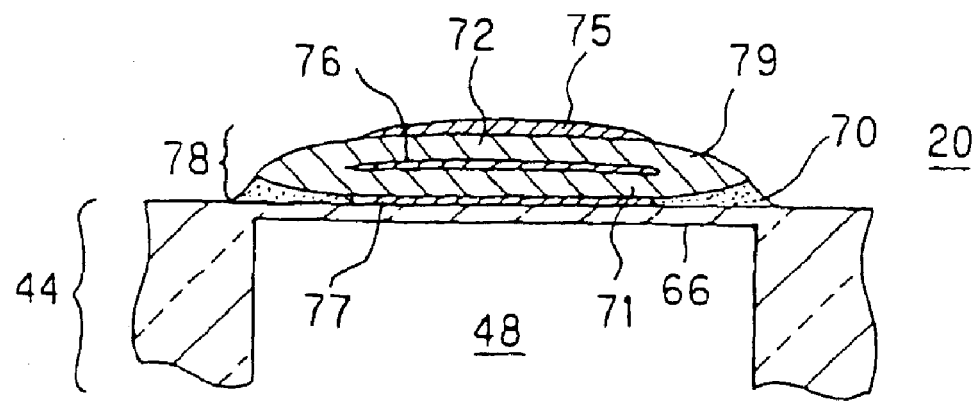
FIG. 6 is a partial sectional view showing still another embodiment in the multilayered piezoelectric/electrostrictive film device according to the present invention.

As shown in FIGS. 1 to 3, a piezoelectric/electrostrictive film device 10 of the present invention includes a substrate 44 formed of ceramic; and a piezoelectric/electrostrictive operation portion 78 including a lower electrode 77, piezoelectric/electrostrictive layer 73, and upper electrode 75 which are successively stacked on the substrate 44 and including a projecting end of the piezoelectric/electrostrictive layer 73 with which an upper surface of the lower electrode 77 and a lower surface of the upper electrode 75 are coated. At least a projecting portion 79 of the piezoelectric/electrostrictive layer 73 is coupled to the substrate 44 via a coupling member 70 constituted of a hybrid material in which inorganic particles are scattered in a matrix of a polymer compound. As shown in FIGS. 4 to 6, a multilayered piezoelectric/electrostrictive film device 20 of the present invention includes the piezoelectric/electrostrictive operation portion 78 including a plurality of electrodes 75 to 77 and a plurality of piezoelectric/electrostrictive layers 71, 72 which are alternately stacked on the substrate 44 and including a projecting end of each of the piezoelectric/electrostrictive layers 71, 72 with which the upper and lower surfaces of the electrodes 75 to 77 are coated. At least the projecting portions 79 of the piezoelectric/electrostrictive layers 71, 72 are coupled to the substrate 44 via the coupling member 70 constituted of the hybrid material in which the inorganic particles are scattered in the polymer compound matrix. Accordingly, there can be provided the piezoelectric/electrostrictive film device which has a flexural displacement not less than that of a related-art piezoelectric/electrostrictive film device and which is superior in high-speed response and which has a high resistance to repeated high-speed driving. Each constituting element will concretely be described hereinafter.

As shown in FIGS. 1 to 6, the substrate 44 in the present invention includes, for example, a structure in which a thin portion 66 having a sheet-like shape is formed integrally with a fixing portion 68 formed of a thick ceramic material. In the substrate 44 of the-structure, the thin portion 66 having the sheet-like shape is solidly attached to the fixing portion 68 in a position other than a position where the piezoelectric/electrostrictive layer 73 is laid. A cavity 48 is usually disposed opposite to the position where the piezoelectric/electrostrictive layer 73 is laid under the thin portion 66.

Moreover, as shown in FIGS. 3 and 6, the thin portion 66 may be a flat plate whose section of a thickness direction is square or rectangular. As shown in FIGS. 2 and 5, a middle portion of the thin portion 66 preferably has a bent shape toward the cavity 48. Alternatively, as shown in FIGS. 1 and 4, a W-shaped section of the thin portion of a thickness direction is preferable in that the flexural displacement is high. The latter W shape is particularly preferable.

It is to be noted that the bent shape shown in FIGS. 2 and 5, and the W-shaped thin portion 66 shown in FIGS. 1 and 4 can be formed by using shrinkage of a piezoelectric/electrostrictive film in a short direction in a skittering step of the piezoelectric/electrostrictive layer 73, or adjusting a skittering shrinkage start timing of upper and lower portions of the piezoelectric/electrostrictive layer 73, a skittering shrinkage, or further the shape of the thin portion 66.

In the present invention, the thickness of the thin portion 66 is preferably in such a range that a mechanical strength of the device is secured and the flexural displacement of the piezoelectric/electrostrictive layer 73 is prevented from dropping by increase of rigidity. Concretely, the thickness is preferably 1 µm to 50 µm, more preferably 3 to 50 µm, most preferably 3 to 12 µm. The thickness of fixing portion 68 is preferably 10 µm or more, more preferably 50 µm or more.

Moreover, the shape of the surface of the substrate 44 on which the piezoelectric/electrostrictive operation portion 78 is laid is not especially limited to a rectangular shape, and may also be a circular shape, or a polygonal shape other than a quadrangular shape, such as a triangular shape.

The substrate 44 in the present invention is not especially limited as long as the substrate is formed of ceramic. The substrate is preferably constituted of a material which does not change in quality at a heat treatment time of the piezoelectric/electrostrictive layer 73 or the electrodes 75, 77 stacked on the thin portion 66 and which is superior in heat resistance and chemical stability. The substrate 44 is preferably formed of an electric insulation material in order to electrically isolate a wiring coupling member to the electrode 77 formed on the substrate 44.

Concretely, examples of the material can include at least one selected from a group consisting of stabilized zirconium oxide, aluminum oxide, magnesium oxide, titanium oxide, spinal, mulling, aluminum nitride, silicon nitride and glass. Above all, the material preferably contains stabilized zirconium oxide, because stabilized zirconium oxide is high in mechanical strength and superior in tenacity and can therefore enhance the durability of the thin portion 66 including a thin structure and loaded with vibration. Additionally, stabilized zirconium oxide has high chemical stability and has remarkably little reactivity with the piezoelectric/electrostrictive layer 73 or the electrodes 75, 77.

Moreover, stabilized zirconium oxide may contain stabilizers such as calcium oxide, magnesium oxide, yttrium oxide, scandium oxide, ytterbium oxide, cerium oxide, and rare earth metal oxide. An added content of these stabilizers is preferably 1 to 30 mol %, more preferably 1.5 to 10 mol % in terms of yttrium oxide or ytterbium oxide. The content of cerium oxide is preferably 6 to 50 mol %, more preferably 8 to 20 mol %. The content of calcium oxide or magnesium oxide is preferably 5 to 40 mol %, more preferably 5 to 20 mol %.

Moreover, among these stabilizers, yttrium oxide is especially preferable, and the content is preferably 1.5 to 10 mol %, more preferably 2 to 4 mol %.

Furthermore, the thin portion 66 may contain, in addition to ceramic as described above, skittering aids such as silicon oxide and boron oxide contained in clay. However, when these components are contained excessively, the substrate 44 and the piezoelectric/electrostrictive layer 73 react with each other, it is therefore difficult to maintain a particular composition of the piezoelectric/electrostrictive layer 73, and a piezoelectric/electrostrictive property is reduced. Therefore, in the thin portion 66 of the substrate 44 in the present invention, the content of silicon oxide or boron oxide contained in clay is preferably 20% or less by mass in the thin portion 66, more preferably 3% or less by mass.

Moreover, in order to enhance the mechanical strength of the thin portion 66, for ceramic constituting the thin portion 66, an average particle diameter of crystal grains is preferably 0.05 to 2 µm, more preferably 0.1 to 1 µm.

Next, the electrodes in the present invention will be described. As shown in FIGS. 1 to 3, at least one pair of the upper electrode 75 and electrodes 75 to 77 are disposed in the upper and lower surfaces of the piezoelectric/electrostrictive layer 73 so as to hold the piezoelectric/electrostrictive layer 73 between the electrodes. In the piezoelectric/electrostrictive film device 20 including the multilayered structure shown in FIGS. 4 to 9, the electrodes are stacked alternately with the piezoelectric/electrostrictive layers 71, 72, and the electrodes 75, 77 are disposed in uppermost and lowermost layers in the multilayered structure of the piezoelectric/electrostrictive layers 71, 72 and electrodes 75 to 77.

Especially in the piezoelectric/electrostrictive film device 20 including the multilayered structure shown in FIGS. 4 to 9, the piezoelectric/electrostrictive layers 71, 72 and electrodes 75 to 77 form the multilayered structure. Additionally, the electrodes 75, 77 are disposed in the uppermost and lowermost layers. Therefore, needless to say, the flexural displacement of the piezoelectric/electrostrictive operation portion 78 increases. The rigidity of the whole piezoelectric/electrostrictive operation portion 78 increases. By a synergistic effect with a bond material described later, there can be provided the piezoelectric/electrostrictive film device which is remarkably high in resonance frequency and in which the high-speed response is possible.

In the present invention, the thicknesses of these electrodes 75, 77 (75 to 77) may be set to be appropriate in accordance with the application. However, when the thickness is excessively large, the electrode functions as a relaxation layer. However, since the flexural displacement is easily reduced, the thickness of the layer is preferably 15 µm or less, more preferably 5 µm or less.

Moreover, the materials of the electrodes 75, 77 (75 to 77) are preferably solid at room temperature, can bear high-temperature oxidation atmosphere at a skittering time when the electrode and the substrate and/or the piezoelectric/electrostrictive layer are integrally formed, and are superior in electric conductivity. Concretely, examples of the material include single-unit metals such as aluminum, titanium, chromium, iron, cobalt, nickel, copper, zinc, niobium, molybdenum, ruthenium, palladium, rhodium, silver, tin, tantalum, tungsten, iridium, platinum, gold, and lead, and an alloy containing at least one of these metals. A cermet material in which the piezoelectric/electrostrictive film or the same material as that of the substrate 44 is dispersed in these metals may also be used.

Moreover, for the materials of the electrodes 75, 77 (75 to 77) in the present invention, a forming method of the piezoelectric/electrostrictive layer 73 (71, 72) is preferably considered. For example, in the piezoelectric/electrostrictive film device 10 shown in FIG. 1, high-melting metals such as platinum which does not change even at a heat-treatment temperature of the piezoelectric/electrostrictive layer 73 is preferably used in the lower electrode 77 already formed on the substrate 44 at the heat-treatment time of the piezoelectric/electrostrictive layer 73. Also in the piezoelectric/electrostrictive film device 20 including the multilayered structure shown in FIGS. 4 to 8, the high-melting metals such as platinum are preferably used in the electrode 77 positioned in the lowermost layer and the intermediate electrode 76 disposed between the piezoelectric/electrostrictive layers 71, 72, which are already formed at the heat-treatment time of the piezoelectric/electrostrictive layers 71, 72.

On the other hand, in the piezoelectric/electrostrictive film device 10 shown in FIG. 1, and the like, the upper electrode (electrode 75 positioned in the uppermost layer in the multilayered piezoelectric/electrostrictive film device 20 shown in FIGS. 4 to 8) 75 formed on the piezoelectric/electrostrictive layer 73 after the heat treatment of the piezoelectric/electrostrictive layer 73 can be formed at a low temperature. Therefore, low-melting metals such as aluminum, gold, and silver may also be used.

It is to be noted that examples of the method of forming the electrode include ion beam, sputtering, vacuum deposition, PVD, ion plating, CVD, plating, screen printing, spray, and dipping.

Next, the piezoelectric/electrostrictive layer 73 in the present invention is disposed between the lower electrode 77 and upper electrode 75 in a range broader than a range in which the upper surface of the lower electrode 77 and the lower surface of the upper electrode 75 are coated. The piezoelectric/electrostrictive layer 73 in the present invention includes the projecting portion 79 which does not contact the upper surface of the lower electrode or the lower surface of the upper electrode. The projecting portion 79 is coupled to the substrate 44 by the coupling member 70 constituted of the hybrid material in which inorganic particles are scattered in the matrix of the polymer compound.

Moreover, the piezoelectric/electrostrictive layers 71, 72 in the multilayered piezoelectric/electrostrictive film device 20 of the present invention shown in FIGS. 4 to 9 are disposed between the electrodes among the plurality of electrodes 75 to 77 in the range broader than that in which the upper and lower surfaces of the electrodes 75 to 77 are coated. The piezoelectric/electrostrictive layers 71, 72 include the projecting portion 79 whose lower or upper surface does not contact the upper or lower surface of the electrodes 75 to 77. The projecting portion 79 is coupled to the substrate 44 by the coupling member 70 constituted of the hybrid material in which the inorganic particles are scattered in the matrix of the polymer compound.

Accordingly, in the piezoelectric/electrostrictive film device 10 (20), the insulation of the respective electrodes 75, 77 (75 to 77) is firmly secured, and the piezoelectric/electrostrictive film device 10 (20) can be formed without any dielectric breakdown or short circuit. Moreover, the coupling member 70 for coupling the substrate 44 to the projecting portion 79 is constituted of the hybrid material in which the inorganic particles are scattered in the matrix of the polymer compound. Therefore, the flexural displacement of the device is substantially equal and the resonance frequency can be increased by 3% or more with respect to the piezoelectric/electrostrictive film device which includes the same material and structure and which does not include the coupling member. The hybrid material constituting the coupling member has a very large tenacity because of the presence of the inorganic particles. Therefore, there can be provided the piezoelectric/electrostrictive film device which has good durability even against the repeated high-speed driving.

It is to be noted that reasons why the piezoelectric/electrostrictive film device 10 (20) of the present invention obtains the flexural displacement not less than that of the piezoelectric/electrostrictive film device including the same material and structure but including no coupling member and why the resonance frequency can be increased by 3% or more are not necessarily apparent. However, by the above-described constitution, this is supposedly because the piezoelectric/electrostrictive layer 73 (71, 72) is hardly restrained in the thickness direction, whereas a tensile stress is applied in a length direction (direction vertical to the thickness direction).

In the present invention, the hybrid material constituting the coupling member includes the inorganic particles scattered in the matrix of the polymer compound as described above.

Examples of the matrix of the hybrid material in the present invention include a material containing a main component of at least one polymer compound selected from a group consisting of vinyl polymer such as an acryl resin, addition polymer such as an epoxy resin and polyurethane, condensation polymer such as polyester and polycarbonate, and polysiloxane polymer which is polymer of an organic silicon compound. Above all, polysiloxane polymer is preferable from standpoints of heat resistance, water resistance, and resistance to chemicals, and water repellency.

Here, polysiloxane polymer in the present invention means polymer including repetition of a basic unit of Si—O—Si.

Additionally, in the present invention, from the standpoints of the heat resistance, water resistance, resistance to chemicals, and water repellency, polysiloxane polymer is especially preferable in which the substituent group is introduced in a part shown in the following general formula (1).

where R is an organic group.

It is to be noted that in the present invention the examples of R in the above general formula (1) include alkyl groups such as a methyl group, ethyl group, and propyl group, aryl group such as a phenyl group, alkenyl groups such as a vinyl group, and substituent alkyl groups such as a γ-methacryloxypropyl group, γ-glycidoxypropyl group, γ-chloropropyl group, γ-mercaptopropyl group, γ-aminopropyl group, and trifluoromethyl group.

Moreover, examples of the inorganic particles scattered in the matrix include fine particles constituted of an oxide of at least one element selected from Ti, Zr, V, Nb, Cr, Mo, W, Al, Mn, Fe, Co, Ni, and Si.

In the present invention, it is possible to combine the matrix of the various polymer compounds with the various inorganic particles. Above all, the hybrid material is preferable in which silica particles are scattered in the matrix containing polysiloxane polymer as the main component. The hybrid material is especially preferable in which the silica particles are scattered in the matrix containing polysiloxane polymer as the main component shown by the general formula (1).

When the hybrid material constitutes the coupling member 70, the rigidity of the piezoelectric/electrostrictive layer 73 can be increased without reducing the flexural displacement of the thin portion 66 and piezoelectric/electrostrictive layer 73. Furthermore, since the material has the large tenacity, the durability against the repeated high-speed driving of the piezoelectric/electrostrictive film device can be increased.

Moreover, for the inorganic particles in the hybrid material in the present invention, from a balance between a request for avoiding the restraint with respect to the piezoelectric/electrostrictive layer of the coupling member and a request for increasing the rigidity of the piezoelectric/electrostrictive layer 73 to enhance the high-speed response, the average particle diameter is preferably 5 nm to 1 μm, more preferably 10 nm to 200 nm.

Moreover, for the inorganic particles, voids among the large-diameter inorganic particles are filled with small-diameter inorganic particles to increase a volume fraction of the inorganic particles in the coupling member. Accordingly, the rigidity of the piezoelectric/electrostrictive layer 73 is further increased, and the high-speed response can be increased. In this respect, the inorganic particles including two-peaks particle size distribution is further preferable. For the inorganic particles including the two-peaks particle size distribution, a ratio (D/C) of an average particle diameter (C) of the large-diameter inorganic particles having a particle diameter larger than that corresponding to an inflection point existing between two peaks to an average particle diameter (D) of small-diameter inorganic particles having a diameter less than that corresponding to the inflection point is preferably 0.05 to 0.7, more preferably 0.1 to 0.5. For the inorganic particles including the two-peaks particle size distribution, in the similar respect, a ratio (F/E) of a mass (E)

of the large-diameter inorganic particles to a mass (F) of the small-diameter inorganic particles is preferably 0.05 to 0.7, more preferably 0.1 to 0.5.

Moreover, the projecting portion 79 of the piezoelectric/electrostrictive layer 73 (71, 72) may have an "incompletely coupled state" as described in JP-A-6-260694. However, considering from the above-described effect, the coupling to the substrate 44 preferably depends on the coupling member 70 in order to obtain a great effect. A non-coupled state directly with respect to the substrate 44 is preferable.

Figure 7:
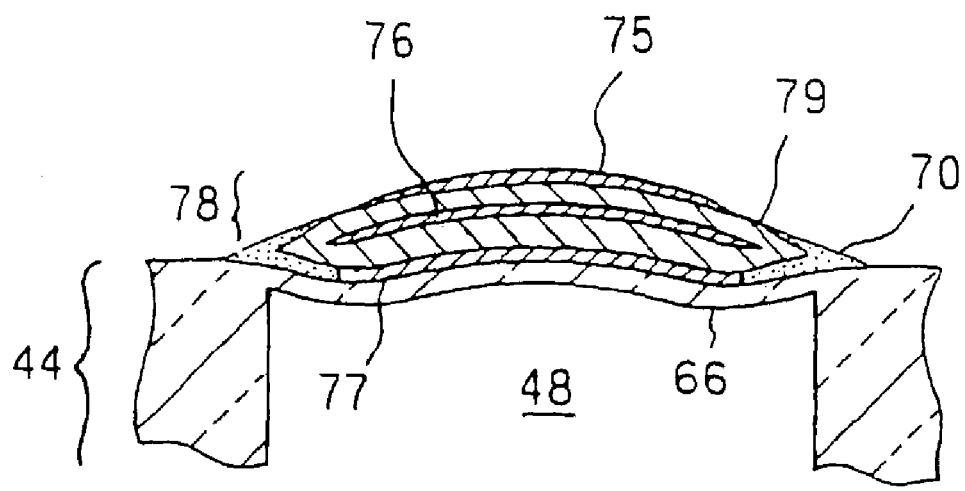
FIG. 7 is a partial sectional view showing still another embodiment in the multilayered piezoelectric/electrostrictive film device according to the present invention.
Figure 8:
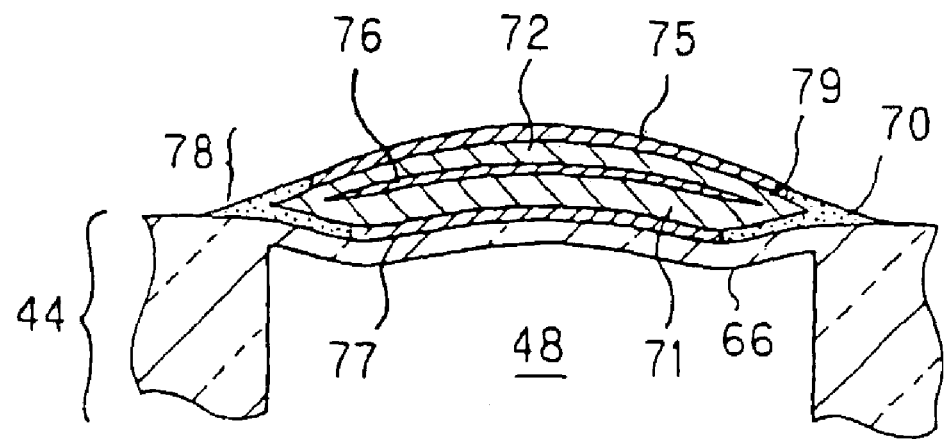
FIG. 8 is a partial sectional view showing still another embodiment in the multilayered piezoelectric/electrostrictive film device according to the present invention.
Figure 10:
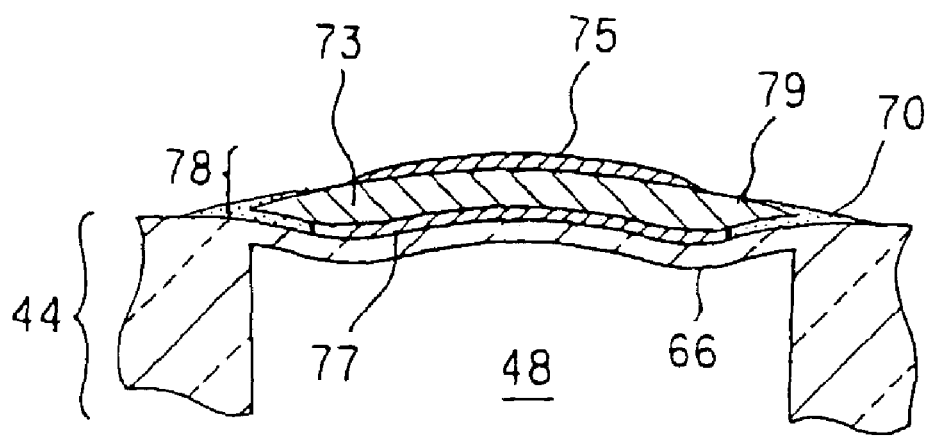
FIG. 10 is a partial sectional view showing still another embodiment of the present invention.

In the present invention, as shown in FIGS. 1 to 6, the coupling member 70 is disposed under at least the projecting portion 79 of the piezoelectric/electrostrictive layer 73, and the lower surface of the projecting portion 79 is coupled to the substrate 44. The device constituted in this manner is preferable in that the high resonance frequency is effectively obtained and the mechanical strength of the coupling member 70 is secured. In this case, the coupling member 70 may couple a part of the lower surface of the projecting portion 79 in the piezoelectric/electrostrictive layer 73. However, the coupling member couples the whole lower surface of the projecting portion 79 of the piezoelectric/electrostrictive layer 73 to the substrate 44. This is preferable in that the high resonance frequency is obtained and weather resistance of the device (moisture resistance, light resistance, acid resistance, resistance to contamination) can be enhanced. As shown in FIGS. 7 and 10, the coupling member 70 is disposed to coat at least a part of the lower and upper surfaces in the projecting portion 79 of the piezoelectric/electrostrictive layer 73, and couples at least a part of the lower and upper surfaces of the projecting portion 79 to the substrate 44. This is more preferable in that a tensile stress in the length direction (direction vertical to the thickness direction) of the piezoelectric/electrostrictive layer is increased to obtain a higher resonance frequency and the weather resistance of the device (moisture resistance, light resistance, acid resistance, resistance to contamination) can further be enhanced.

Figure 11:
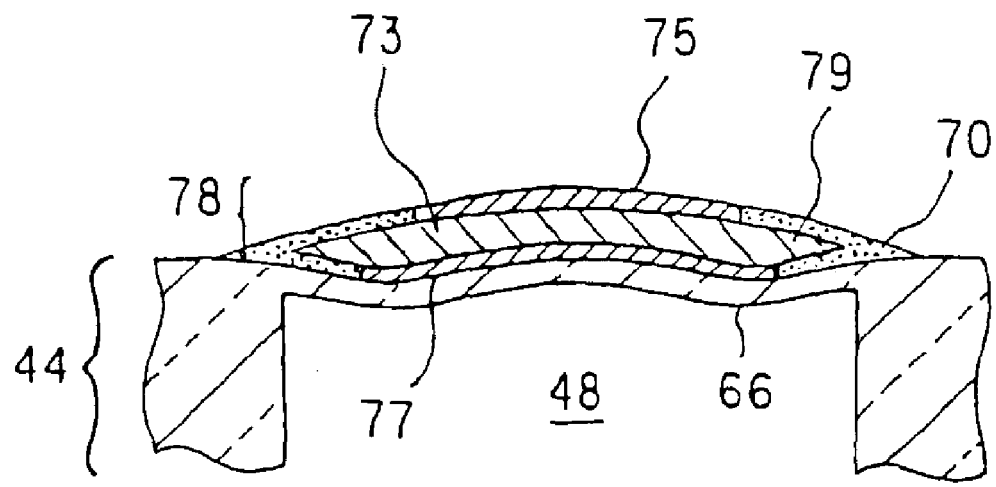
FIG. 11 is a partial sectional view showing still another embodiment of the present invention.
Figure 13:
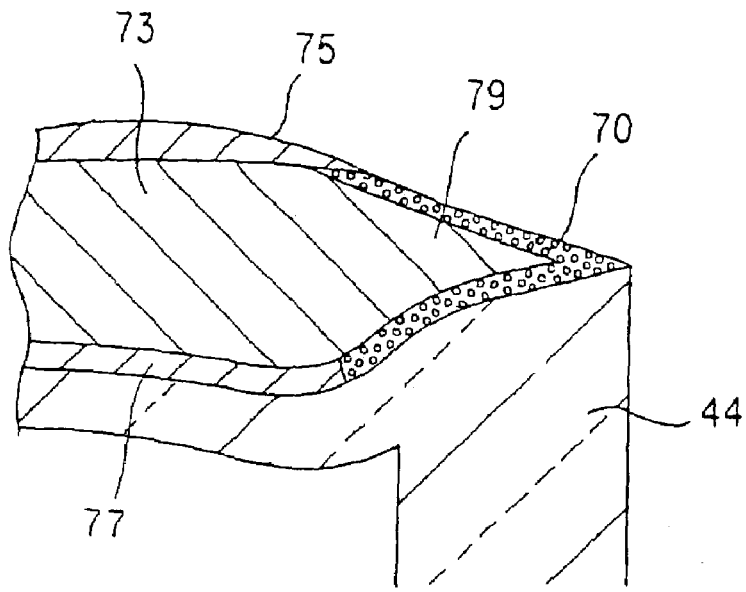
FIG. 13 is a partial enlarged view of the piezoelectric/electrostrictive film device shown in FIG. 11.
Figure 14:
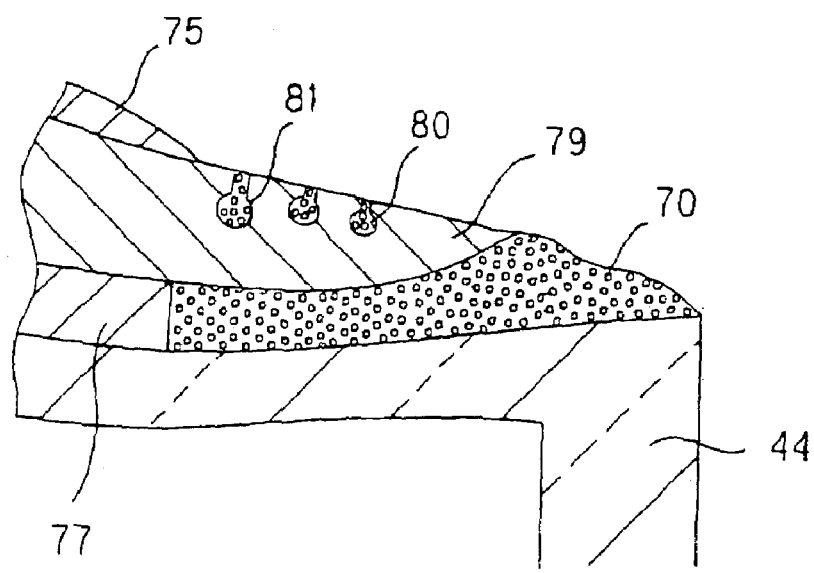
FIG. 14 is a partial enlarged view of the piezoelectric/electrostrictive film device shown in FIG. 1.
Figure 15:
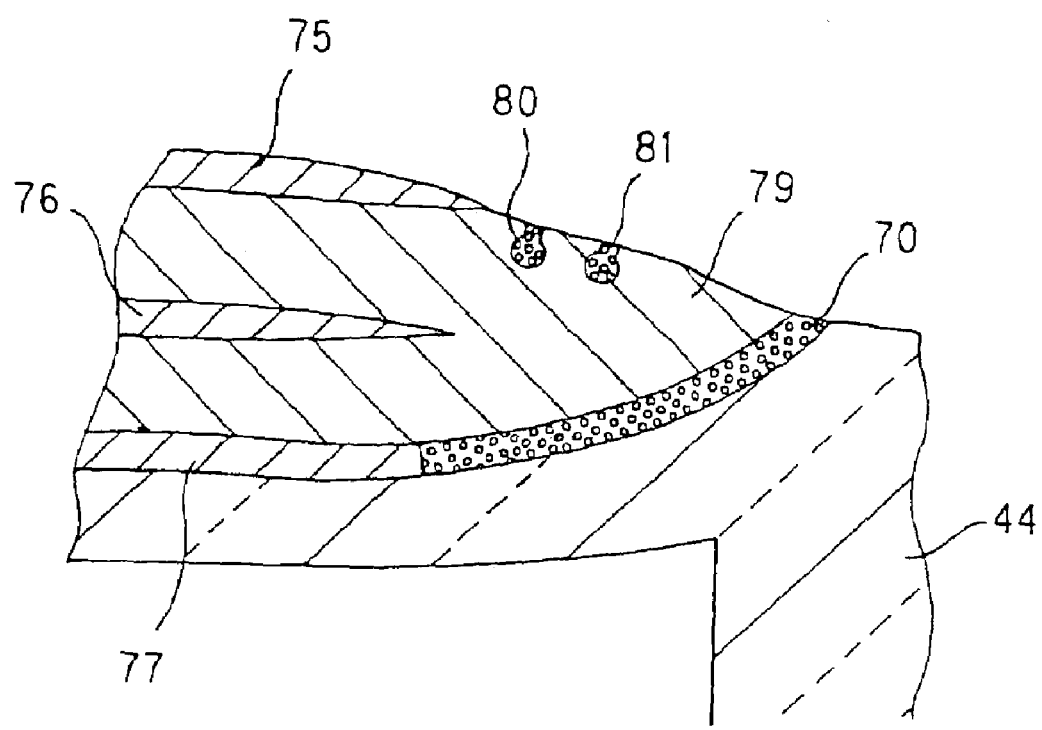
FIG. 15 is a partial enlarged view of the piezoelectric/electrostrictive film device shown in FIG. 4.

Moreover, in addition to the above-described standpoints, preferably from a standpoint of inhibition of the drop in insulation distance and durability, as shown in FIGS. 14, 15, the lower surface of the projecting portion 79 of the piezoelectric/electrostrictive layer 73 is coupled to the substrate 44 by the coupling member 70, while air holes 80 opened in the upper surface of the projecting portion 79 are filled with the same material 81 as the coupling member 70 (the air holes are generated by factors such as nonuniformity of the piezoelectric/electrostrictive material and temperature unevenness at the heat-treatment time, but it is not easy to completely remove the air holes, and the insulation distance is reduced, the durability is lowered because the air holes form entrance ports of moisture and impurities, and other adverse influences are exerted.) As shown in FIGS. 11 and 13, it is especially preferable that the coupling member 70 is disposed to coat at least the whole protecting portion 79 of the piezoelectric/electrostrictive layer 73, and at least the whole projecting portion 79 of the piezoelectric/electrostrictive layer 73 is coupled to the substrate 44 by the coupling member 70.

Moreover, the outer surface of the coupling member 70 shown in FIGS. 7, 8, 10, 11 is gently inclined toward the substrate 44, and this is preferable in that the mechanical strength of the coupling member 70 is increased. Alternatively, the coupling member 70 gradually increases in thickness toward the tip end of the projecting portion from a start point in which the coupling member 70 is disposed, and has a maximum thickness in the tip end of the projecting portion. This is preferable in that the tensile stress of the piezoelectric/electrostrictive layer in the length direction (direction vertical to the thickness direction) can effectively be increased.

As shown in FIGS. 10, 11, and the like, in the present invention, the coupling member 70 does not have to be disposed so as to coat a contact surface with the electrodes such as the upper electrode 75 of the piezoelectric/electrostrictive layer 73, or the upper electrode 75 (the electrode 75 of the uppermost layer in the multilayered piezoelectric/electrostrictive film device 20 shown in FIGS. 4 to 6). Additionally, it is also preferable to fill the air holes 80 opened in the upper surface of the piezoelectric/electrostrictive layer 73 (including the upper surface of the projecting portion 79) with the same material 81 as the coupling member (not shown) in that the high resonance frequency is obtained and the weather resistance of the device can further be enhanced.

Figure 9:
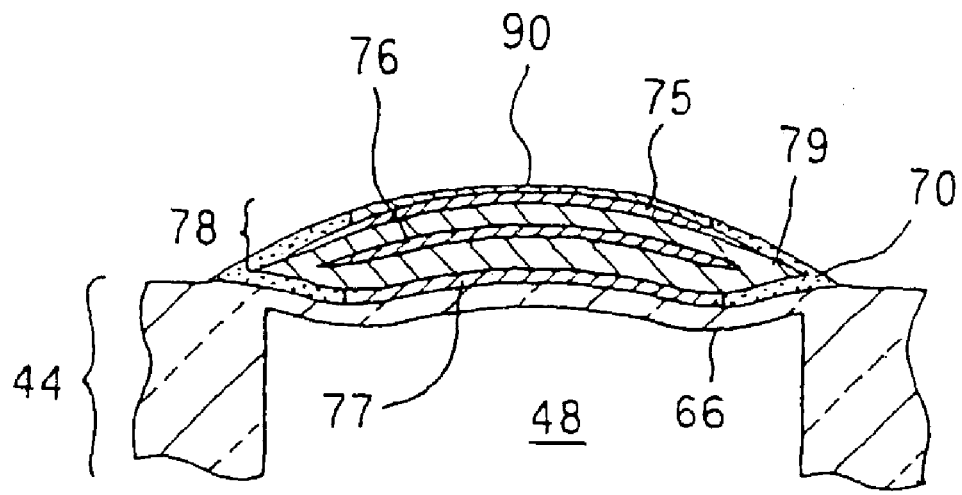
FIG. 9 is a partial sectional view showing still another embodiment in the multilayered piezoelectric/electrostrictive film device according to the present invention.
Figure 12:
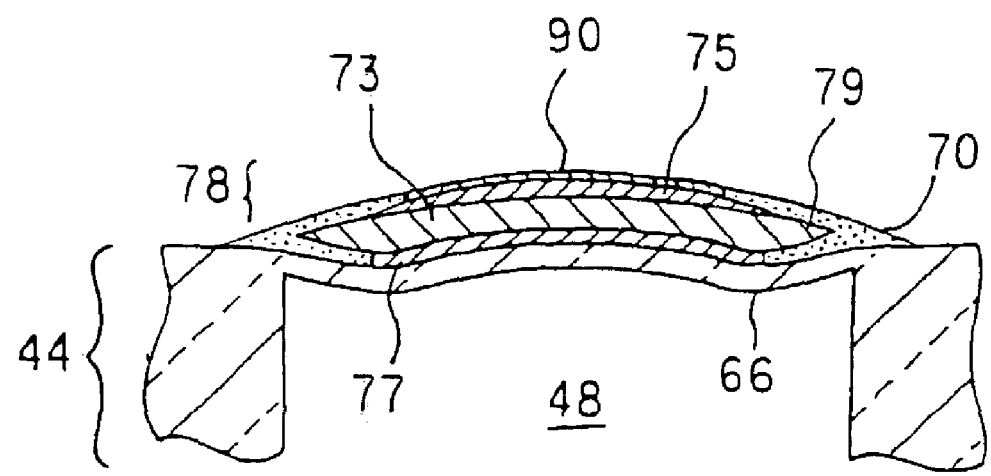
FIG. 12 is a partial sectional view showing still another embodiment of the present invention.

Moreover, in the present invention, a loosely bound layer 90 constituted of the same material as the coupling member 70 is disposed in a thickness of 1/15 or less, preferably 1/30 or less with respect to a total thickness of the thin portion 66 and piezoelectric/electrostrictive operation portion 78 so as to coat the contact surface with the electrodes such as the upper electrode 75 of the piezoelectric/electrostrictive layer 73 (not shown in this mode) or the upper electrode 75 as shown in FIG. 12 (the electrode 75 of the uppermost layer in the multilayered piezoelectric/electrostrictive film device 20 shown in FIG. 9). This is also preferable in that the flexural displacement is hardly reduced and the resonance frequency and weather resistance of the device can remarkably be enhanced. Above all, it is more preferable to dispose the loosely bound layer 90 as shown in FIG. 12 in that the manufacturing process of the device is simplified and even dispersion of the shape of the device can flexibly be handled.

Moreover, as shown in FIG. 12, the loosely bound layer 90 is integrally formed with the coupling member 70, the outer surface is gently inclined toward the substrate 44, the thickness gradually increases toward the tip end of the projecting portion 79 of the piezoelectric/electrostrictive layer 73, and the loosely bound layer has the maximum thickness in the tip end of the projecting portion 79. This is preferable in that the tensile stress in the length direction (direction vertical to the thickness direction) of the piezoelectric/electrostrictive layer 73 can effectively be increased.

As a method of forming the coupling member 70 in the present invention, for example, a method of coating the piezoelectric/electrostrictive layer 73 with a coating liquid in which the inorganic particles and polymerizable oligomer corresponding to the polymer compound constituting the matrix in the hybrid material after drying are mixed in a dispersing solution is preferable. According to the method, in a drying step associated with the formation of the coupling member, the shrinkage of the coupling member is reduced, the cracks of the coupling member and piezoelectric/electrostrictive layer are inhibited from being generated, and the piezoelectric/electrostrictive film device having the above-described preferable characteristics can be obtained. It is to be noted that in the present invention, it is also possible to use the coating liquid of the polymer compound mixed in the dispersing solution from the beginning. However, it is preferable to mix a polymerizable oligomer in the dispersing solution in order to form the coupling member which has the preferable characteristics.

In the present invention, a polar medium such as water, methanol, ethanol, propanol, isopropyl alcohol, butanol, acetone and the like is preferable as a dispersing medium for said coating liquid. This is because a homogeneous dispersion is easily obtained.

Moreover, as the inorganic particles mixed in the dispersing medium, as described above, fine particles are preferable which are constituted of the oxide of at least one element selected from Ti, Zr, V, Nb, Cr, Mo, W, Al, Mn, Fe, Co, Ni, and Si.

Moreover, the average particle diameter of the inorganic particles is preferably 5 nm to 1 µm, more preferably 10 nm to 200 nm. When the average particle diameter is less than 5 nm, an effect of inhibiting the shrinkage of the coupling member is reduced in the drying step associated with the formation of the coupling member. On the other hand, when the average particle diameter exceeds 1 µm, the inorganic particles are easily precipitated in the coating liquid, and it is difficult to obtain the homogeneous coupling member.

Furthermore, the inorganic particles further have the two-peaks particle size distribution. The ratio (D/C) of the average particle diameter (C) of the large-diameter inorganic particles having a particle diameter larger than that corresponding to the inflection point existing between two peaks to the average particle diameter (D) of the small-diameter inorganic particles having the diameter not more than that corresponding to the inflection point is preferably 0.05 to 0.7.

Moreover, for the inorganic particles which have the two-peaks particle size distribution, the voids among the large-diameter inorganic particles can be filled with the small-diameter inorganic particles to increase the volume fraction of the inorganic particles in the coupling member. Accordingly, the shrinkage of the coupling member can further be suppressed in the drying step associated with the formation of the coupling member.

Furthermore, examples of the polymerizable oligomer in the present invention include a polymerizable oligomer for a vinyl polymer such as the acryl resin, addition polymer such as the epoxy resin and polyurethane, condensation polymer such as polyester and polycarbonate, and polysiloxane polymer which is polymer of the organic silicon compound. Above all, the polymerizable oligomer in which several to several tens of monomers shown in the following general formula (2) are condensation-polymerized is preferable.

$$R_nSi(OR')_{4-n} \quad (2),$$

where R and R' denote the same type or different types of observer groups, and n is an integer of 0 to 3.

In the present invention, in the above general formula (2), examples of R include the alkyl groups such as the methyl group, ethyl group, and propyl group, the aryl groups such as the phenyl group, the alkenyl groups such as the vinyl group, and the substituent alkyl groups such as the γ-methacryloxypropyl group, γ-glycidoxypropyl group, γ-chloropropyl group, γ-mercaptopropyl group, γ-aminopropyl group, and trifluoromethyl group. Examples of R' include the alkyl groups such as the methyl group, ethyl group, propyl group, and butyl group, the aryl groups such as the phenyl group, and the substituent alkyl groups such as a β-methoxy ethoxy group, and acetyl group.

It is to be noted that in the present invention, the polymerizable oligomer is condensation-polymerized, for example, by dehydration or dealcoholization reaction by the drying described later, and accordingly desired polymer compounds constituting the matrix of the coupling member can be obtained.

In the present invention, a blend ratio of the polymerizable oligomer to the inorganic particles is preferably set to be in an appropriate range in accordance with the type of each component. For example, with the use of the polymerizable oligomer obtained by condensation-polymerizing the monomers shown in the general formula (2), it is preferable to contain the inorganic particles in the coating liquid at a ratio of 0.1 to 300 parts by weight with respect to 100 parts by weight of the polymerizable oligomer. It is more preferable to contain the inorganic particles in the coating liquid at a ratio of 1 to 100 parts by weight.

In the present invention, examples of the method of coating the piezoelectric/electrostrictive layer 73 with the coating liquid include a dipping method, a spray method, and a coat method such as a spin coating method. The spin coating method is preferable in that the formation of an excessively thick coat layer in the portion other than the coupling member can easily be avoided.

Moreover, in order to dispose the coupling member 70 coupling at least the whole lower surface of the projecting portion 79 of the piezoelectric/electrostrictive layer 73 to the substrate 44 without causing any large drying shrinkage, the coating liquid having a liquid viscosity of 1000 cP or less is preferably used. It is more preferable to use the liquid having a viscosity of 300 cP or less, and it is especially preferable to use the liquid with a viscosity of 50 cP or less.

Moreover, the air holes 80 opened in the contact surface with the upper electrode 75 of the piezoelectric/electrostrictive layer 73 are filled with the same material as the coupling member 70. Alternatively, the loosely bound layer 90 having a predetermined thickness is disposed so as to coat the contact surface with the electrodes such as the upper electrode 75 of the piezoelectric/electrostrictive layer 73 or the upper electrode 75 (the electrode 75 of the uppermost layer in the multilayered piezoelectric/electrostrictive film device 20 shown in FIG. 9). In this case, the whole piezoelectric/electrostrictive layer 73 and/or upper electrode 75 (electrode 75 of the uppermost layer) may be coated with the coating liquid. Additionally, in order to dispose the loosely bound layer 90 in a thickness of ⅟₁₅ or less, more preferably ⅟₃₀ or less with respect to the total thickness of the thin portion 66 and piezoelectric/electrostrictive operation portion 78, immediately after dropping the coating liquid, the spin coating method is preferably performed at a rotation speed of 1500 rpm or more. Furthermore, only to fill the opened air holes 80, after the coating by the spin coating method, and immediately after dropping the coating liquid, the spin coating method is preferably performed at a rotation speed of 2500 rpm or more. A step of spraying compressed air, or a step of wiping a contact layer surface may also be performed. It is to be noted that even when the whole piezoelectric/electrostrictive layer is coated with a coating agent by the dipping method or spray method, the step of spraying the compressed air can be performed to dispose the loosely bound layer 90. However, the formation by the spin coating method is preferable in that a thin and homogeneous layer can easily be formed.

In the present invention, after applying the coating liquid, the coupling member is formed by the drying. In the drying, appropriate conditions are preferably selected in accordance with the type of the composition of the coating liquid. For example, the coating liquid is mixed with the polymerizable oligomer, which is the constituting material of the matrix, in accordance with the vinyl polymers such as the acryl resin, addition polymers such as the epoxy resin and polyurethane, or condensation polymers such as polyester and polycarbonate. In this case, after applying the coating liquid, the layer is left to stand at room temperature and the drying may be performed.

On the other hand, the polymerizable oligomer for the polysiloxane polymer which is the constituting material of the matrix is mixed in the coating liquid. In this case, after applying the coating liquid, the layer is left to stand for ten or more minutes at the room temperature, a large part of the solvent is removed, and thereafter an atmospheric temperature is raised at a predetermined temperature at a speed of 600° C./Hr or less preferably to perform the drying by heating.

When the heating and drying are performed immediately after the coating, or the temperature is rapidly raised to perform the drying, the solvent in the coating liquid rapidly evaporates. Accordingly, the coating liquid rapidly contracts, the cracks are generated in the coupling member, or an interface between the coupling member and piezoelectric/electrostrictive layer sometimes peels.

Moreover, the drying by the heating is performed preferably at 60 to 120° C., more preferably at 100 to 120° C. In the drying at a temperature exceeding 120° C., for the similar reasons as those of the leaving to stand at room temperature, the solvent in the coating liquid rapidly evaporates, the coating liquid accordingly rapidly contracts, and the coupling member is cracked, or the interface between the material and the piezoelectric/electrostrictive layer sometimes peels. On the other hand, in the drying at a temperature lower than the heating temperature, the organic solvent and the moisture dissolved in the solvent are insufficiently removed.

When the coating liquid mixed with the polymerizable oligomer corresponding to the polysiloxane polymer is applied, further after the drying, a hardening treatment by the heating at a higher temperature is preferably performed continuously or in a separate step. Concretely, the heating preferably at a temperature of 700° C. or less is preferable, the heating at a temperature of 600° C. or less is more preferable, the heating at a temperature less than 500° C. is further preferable, and the heating at a temperature less than 450° C. is especially preferable.

When the temperature of the hardening treatment by the heating exceeds the above-described temperature range, the components such as Si in the coupling member reacts with the material constituting the piezoelectric/electrostrictive layer to deteriorate the performance of the piezoelectric/electrostrictive layer. According to circumstances, since defects are generated in the piezoelectric/electrostrictive layer, dielectric or mechanical breakdown sometimes occurs. The organic components in the coupling member are decomposed, and the coupling member is sometimes cracked.

It is to be noted that in the present invention, when a constituting ratio of the polymerizable oligomer to the inorganic particles in the coating liquid is adjusted, or when the heating temperature at the hardening treatment time is adjusted to change a bond strength of Si—O-Si bond, it is possible to optimize mechanical properties such as hardness (hardness rises as the temperature rises), and chemical properties such as water repellency.

The material of the piezoelectric/electrostrictive layer 73 (71, 72) in the present invention shown in FIG. 1, and the like is not especially limited, and may be crystalline or amorphous, as long as the material causes field inductive strains such as a piezoelectric or electrostrictive effect. A semiconductor, ceramic, ferroelectric ceramic, or antiferroelectric ceramic may also be used, and may appropriately be selected or used in accordance with the application.

Concrete examples of the material include ceramic containing one or two or more of lead zirconate, lead titanate, lead zirconate titanate, lead magnesium niobate, lead nickel niobate, lead zinc niobate, lead manganese niobate, lead antimony stannate, lead manganese tungstate, lead cobalt niobate, barium titanate, sodium bismuth titanate, potassium sodium niobate, and strontium bismuth tantalite. Especially, a material containing lead zirconate titanate (PZT-system) and lead magnesium niobate (PMN-system) as the main components, or sodium bismuth titanate as the main component is especially preferable, in that stabilized composition having a high electromechanical coupling coefficient and piezoelectric constant and little reactivity with the ceramic substrate at the skittering time of the piezoelectric/electrostrictive film is obtained.

Furthermore, a material may also be used including the ceramic material containing a small amount components to which at least one alone or two or more oxides of lantern, calcium, strontium, molybdenum, tungsten, barium, niobium, zinc, nickel, manganese, cerium, cadmium, chromium, cobalt, antimony, iron, yttrium, tantalum, lithium, bismuth, and tin are added. For example, when lantern or strontium is contained in lead zirconate, lead titanate, and lead magnesium niobate as the main components, advantages can sometimes be obtained that anti-electric field or piezoelectric property can be adjusted.

In the present invention, from a standpoint that the mechanical strength and desired flexural displacement of the device be secured, the thickness of the piezoelectric/electrostrictive layer 73 shown in FIG. 1, and the like is preferably substantially equal to that of the thin portion 66 of the substrate 44. Concretely, the ratio of the thickness to that of the thin portion 66 of the substrate 44 (thin portion/piezoelectric/electrostrictive layer) is preferably 0.1 to 30, more preferably 0.3 to 10, especially preferably 0.5 to 5.

With the ratio of the thickness to that of the thin portion 66 of the substrate 44 (substrate/piezoelectric/electrostrictive layer) in this range, when the substrate 44 is coated with the piezoelectric/electrostrictive material, and heat-treated to form the piezoelectric/electrostrictive layer 73, the substrate 44 (thin portion 66) easily follows skittering shrinkage of the piezoelectric/electrostrictive layer 73, and can be integrated with the dense piezoelectric/electrostrictive layer 73 without causing the peels. It is also possible to impart sufficient resistance to the vibration by the bend of the piezoelectric/electrostrictive layer 73.

Additionally, even in the thickness of the piezoelectric/electrostrictive layer 73, in order to realize miniaturization of the device, the thickness is preferably 5 to 100 μm, more preferably 5 to 50 μm, especially preferably 5 to 30 μm.

Moreover, in the multilayered piezoelectric/electrostrictive film device 20 shown in FIGS. 4 to 8, when the multilayered piezoelectric/electrostrictive film device is formed in a thin film state, aspect ratio can be raised. In this respect, the thickness per layer of the piezoelectric/electrostrictive layers 71, 72 is preferably small as 30 μm or less. Furthermore, it is preferable to form the plurality of piezoelectric/electrostrictive layers 71, 72 so that the thickness gradually decreases in order from the lower layer. For example, the layers are preferably formed so that a thickness $t_n$ of the n-th piezoelectric/electrostrictive layer from below satisfies the following equation: $t_n \leq t_{n-1} \times 0.95$. A strain amount of the piezoelectric/electrostrictive layer is larger, when the piezoelectric/electrostrictive layer is thinner in the same driving voltage. Therefore, when the piezoelectric/ electrostrictive layer formed above is deformed larger than the piezoelectric/electrostrictive layer formed below, bend efficiency is raised, and flexural displacement can more effectively be developed.

The piezoelectric/electrostrictive layer 73 in the present invention can be obtained, for example, by stacking the piezoelectric/electrostrictive material constituted of the ceramic material on the lower electrode 77 formed on the substrate 44 (stacking each or all of the piezoelectric/electrostrictive layers 71, 72 in the multilayered piezoelectric/electrostrictive film device 20 shown in FIGS. 4 to 8), and thereafter performing the heat treatment at a predetermined temperature.

For example, the piezoelectric/electrostrictive material for use in the present invention can be prepared by an oxide mixing method, coprecipitation method, or alcoxide method.

Moreover, examples of the method of applying the piezoelectric/electrostrictive material include various thick-film forming methods such as a screen printing method, dipping method, coat method, and electrophoretic migration method, and various thin-film forming methods such as an ion beam method, sputtering method, vacuum deposition method, ion plating method, chemical vapor deposition method (CVD), and plating. Above all, since the piezoelectric/electrostrictive layer 73 having satisfactory piezoelectric/electrostrictive properties is obtained, the thick-film forming methods such as the screen printing method, dipping method, coat method, and electrophoretic migration method are preferable.

It is to be noted that to dispose the projecting portion 79, the piezoelectric/electrostrictive material may be printed or applied in a broader range so as to coat the upper and lower surfaces of the respective electrodes. In this case, for example, when a material having little reactivity with the piezoelectric/electrostrictive materials such as zirconium oxide at the heating treatment time is selected as the material of the substrate, the projecting portion 79 of the piezoelectric/electrostrictive layer can be set to a completely non-coupled state with respect to the substrate 44.

Moreover, when the multilayered piezoelectric/electrostrictive film device 20 shown in FIGS. 4 to 8 is formed, for example, the electrode 77 is stacked on the substrate 44, thereafter the piezoelectric/electrostrictive materials are stacked alternately with the plurality of electrodes 75, 76 by the above-described various methods, and finally the electrode 75 may be disposed.

In the present invention, after forming the piezoelectric/electrostrictive material on the lower electrode 77 (after stacking each piezoelectric/electrostrictive material in the lowermost layer, or between the electrodes positioned in the intermediate layer in the multilayered piezoelectric/electrostrictive film device 20 shown in FIG. 4, and the like, or after stacking all the necessary layers of the piezoelectric/electrostrictive material), the heating treatment may be performed at a temperature of 1000 to 1400° C. In this case, in order to prevent evaporation of each component in the piezoelectric/electrostrictive material and to obtain a ceramic composite having a predetermined composition, it is preferable to also dispose an atmosphere-controlling material having the same composition as that of the piezoelectric/electrostrictive material.

Figure 17:
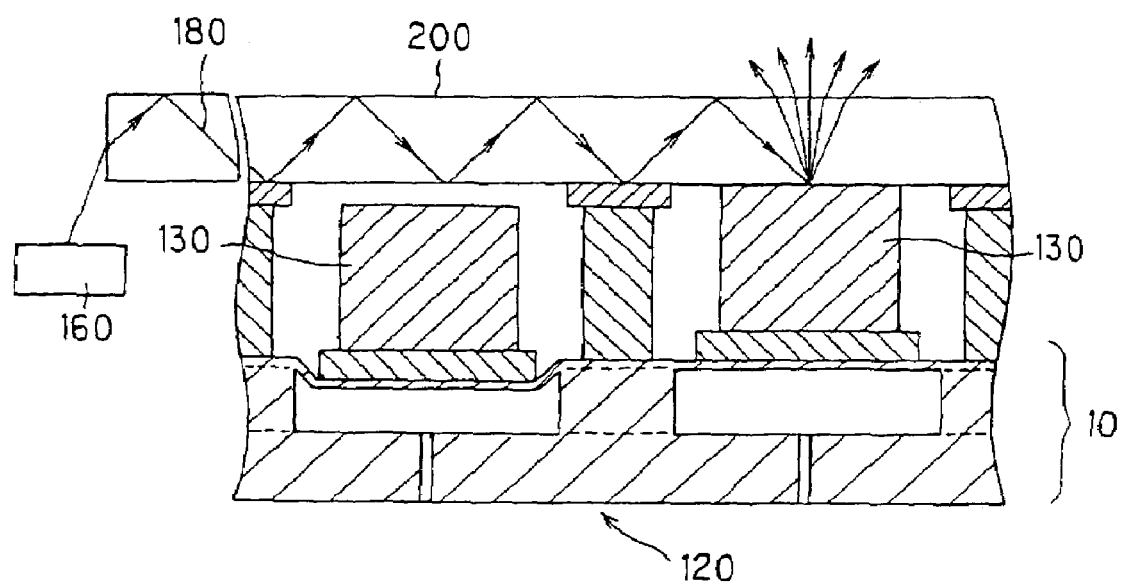
FIG. 17 is a sectional view showing one example of a display device using the piezoelectric/electrostrictive film device of the present invention.
Figure 18:
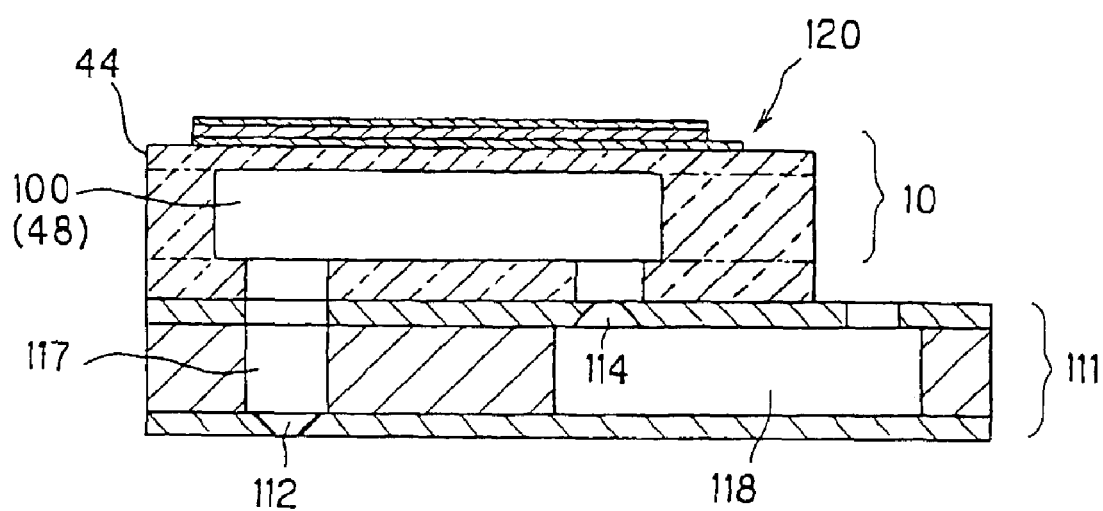
FIG. 18 is a sectional view showing one example of an ink jet printer head using the piezoelectric/electrostrictive film device of the present invention.
Figure 19:
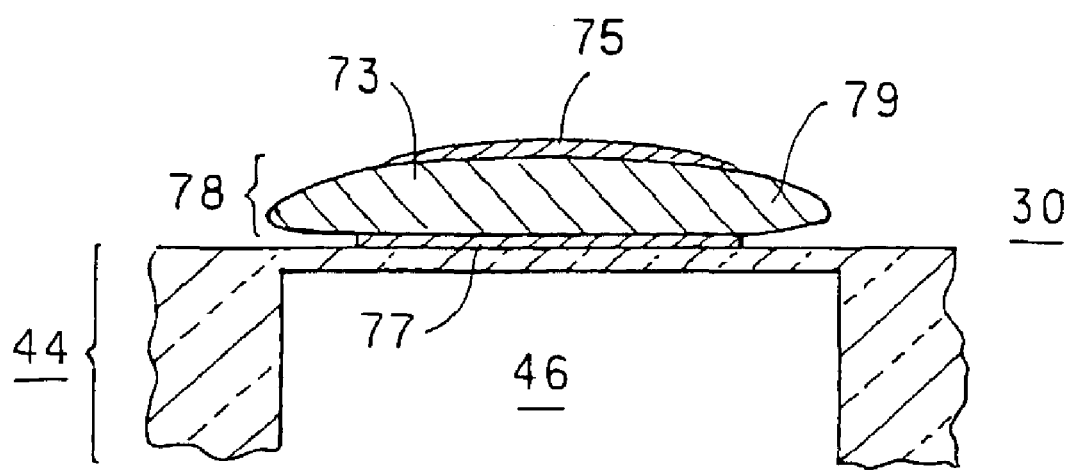
FIG. 19 is a partial sectional view showing one example of a related-art piezoelectric/electrostrictive film device.

The piezoelectric/electrostrictive film device and the manufacturing method of the device have been described above, but the piezoelectric/electrostrictive film device of the present invention can also be used as a display device shown in FIGS. 17, 18, or a driving portion 120 of an ink jet printer head. Concretely, as shown in FIG. 17, a light guide plate 200 for introducing a light 180 from a light source 160 is disposed. Additionally, the driving portion 120 including the piezoelectric/electrostrictive film device 10 of the present invention as a main constituting element is disposed opposite to the rear surface of the light guide plate 200, and opposite to a pixel. Furthermore, pixel constituting materials 130 are stacked on the driving portion 120, and the pixel constituting materials 130 can be coupled to or uncoupled from the light guide plate 200 by a driving operation of the driving portion 120 to constitute a display device. Moreover, as shown in FIG. 18, the driving portion 120 including the piezoelectric/electrostrictive film device 10 of the present invention as the main constituting element and including a pressurizing chamber 100 constituted of the cavity 48 of the substrate 44 is integrally bonded to an ink nozzle member 111 including a nozzle 112 opened to the outside from the pressurizing chamber 100 of the driving portion 120 through a channel for ink jet 117, and an orifice 114 opened into the pressurizing chamber 100 of the driving portion 120 from an ink supply source through a channel for ink supply 118. Accordingly, the ink jet printer head can be constituted. The constitution of the display device or the ink jet printer head is described in JP-A-2001-343598 and JP-A-11-147318, the whole disclosure thereof is incorporated herein by reference.

EXAMPLE

The present invention will be described hereinafter in more detail by examples of a piezoelectric film device, but the present invention is not limited to these examples. It is to be noted that evaluation was performed as follows with respect to each example and comparative example.

Evaluation Method (1) Flexural Displacement

An electric field of 3 kV/mm was applied to each piezoelectric film device obtained in each example or comparative example at room temperature. The resulting displacement was measured using a laser Doppler vibration meter.

(2) Resonance Frequency

The laser Doppler vibration meter, and an FFT analyzer were used to measure the resonance frequency with respect to the piezoelectric film devices obtained in the example and comparative example.

Concretely, a swept sine waveform (waveform containing a plurality of frequency components) generated by the FFT analyzer was, applied to the device to drive the device. The vibration of the device was measured with the laser Doppler vibration meter, a speed output of the laser Doppler vibration meter was inputted into the FFT analyzer to analyze the frequency, and a lowest level peak was regarded as the resonance frequency.

(3) Penetration Depth of Micro Vickers Indenter

An indenter of micro hardness tester was used to measure a penetration depth on the following conditions with respect to the coupling member, piezoelectric/electrostrictive layer, and substrate of the piezoelectric film device obtained in the example and comparative example.
1) Apparatus: Shimazu dynamic ultra micro hardness tester DUH-201
2) Indenter: Diamond indenter having a Vickers shape at an opposite angle of 136°
3) Test mode: Load-unload test (test for increasing a load at a constant speed, temporarily holding the load, and decreasing the load at a constant speed)

4) Indentation load: 1 gf
5) Indentation speed: 0.145 gf/sec
6) Load hold time: 10 sec
7) Others: Objects to be tested (electrode, piezoelectric/electrostrictive layer, and substrate) are micro. Alternatively, the Vickers indenter cannot be pushed in on the appropriate conditions for reasons such as a curved surface and concave/convex portion. In this case, the same material having a shape in which the Vickers indenter can be pushed on the appropriate conditions is used as the object to be tested to perform the measurement.

(4) Average Particle Diameter, and Particle Size Distribution of Inorganic Particles The inorganic particles used in the example and comparative example were sufficiently dispersed in isopropanol as the dispersing medium. Additionally, a super-dynamic light scattering spectrophotometer DLS7000 manufactured by Otsuka Electronics Co., Ltd. was used to measure the average particle diameter and particle size distribution of the inorganic particles by a dynamic light, scattering method.

Example 1

A platinum-made lower electrode (dimension: 1.2×0.8 mm, thickness: 3 µm) was formed on a substrate whose thin portion and fixing portion were both made of $Y_2O_3$-stabilized $ZrO_2$ (dimension of the thin portion: 1.6×1.1 mm, thickness: 10 µm) by the screen printing method. The heat treatment at a temperature of 1300° C. for 2 hours was carried out to integrate the electrode with the substrate.

Thereon, a piezoelectric material constituted of $(Pb_{0.999}La_{0.001})(Mg_{1/3}Nb_{2/3})_{0.375}Ti_{0.375}Zr_{0.250}O_3$ in which part of Pb was substituted with 0.1 mol % of La (average particle diameter of 0.49 µm, maximum particle diameter of 1.8 µm) was layered in a thickness of 20 µm in a broader range of 1.3×0.9 mm including the surface corresponding to the upper surface of the lower electrode by the screen printing method.

Subsequently, the atmosphere-controlling material having the same composition as that of the piezoelectric material was placed in a container, and the layered piezoelectric material on the electrode-formed substrate was heat-treated in the container at 1275° C. for two hours. The thickness of the piezoelectric layer after the heat treatment was 13 µm.

Subsequently, the upper electrode of gold was formed in a thickness of 0.5 µm in a range of 1.2×0.8 mm on the piezoelectric layer by the screen printing method, and heat-treated at 60° C.

Subsequently, a portion of the obtained device on a side opposite to a surface of the substrate in which the piezoelectric/electrostrictive layer and electrode were disposed was covered with a UV sheet and fixed onto a sample stage so that the coating liquid did not adhere thereon as a result of being spoiled by run-around coating liquid. 30% by mass of colloidal silica which had the two-peaks particle size distribution and in which large-diameter amorphous silica having an average particle diameter of 100 nm larger than an inflection point of 50 nm existing between two peaks was mixed with small-diameter amorphous silica having an average particle diameter of 20 nm not more than the inflection point of 50 nm was mixed with 70% by mass of a polymerizable oligomer liquid containing 20% by mass (content in the total amount of the polymerizable oligomer liquid) of mol mixture of tetraethoxysilane and methylethoxysilane in a mixed dispersing medium of isopropyl alcohol and water to prepare the coating liquid. The whole device was coated with the liquid by the spin coating method. In this case, the sample stage was rotated first at 500 rpm. Immediately after dropping the coating liquid, the rotation number was increased to 2000 rpm, and the stage was rotated for 30 seconds. Colloidal silica containing large-diameter amorphous silica mixed with small-diameter amorphous silica was prepared by mixing/agitating 70% by mass of colloidal silica (solid concentration 20% by mass) containing large-diameter amorphous silica having an average particle diameter of 100 nm dispersed in isopropyl alcohol with 30% by mass of colloidal silica (solid concentration 20% by mass) containing small-diameter amorphous silica having an average particle diameter of 20 nm dispersed in isopropyl alcohol.

Finally, after stopping the rotation, the device coated with the coating liquid for the inorganic thin film was left to stand at room temperature for 30 minutes. Thereafter, the temperature was raised at a temperature rise speed of 200° C./h, held at 80° C. to 120° C. for one hour, and continuously raised at 300° C. The hardening treatment was performed at the same temperature for 60 minutes to harden the coupling member for coupling the whole projecting portion of the piezoelectric/electrostrictive layer to the substrate and the loosely bound layer with which the upper electrode was coated. Accordingly, the piezoelectric/electrostrictive film device was manufactured.

Figure 16:
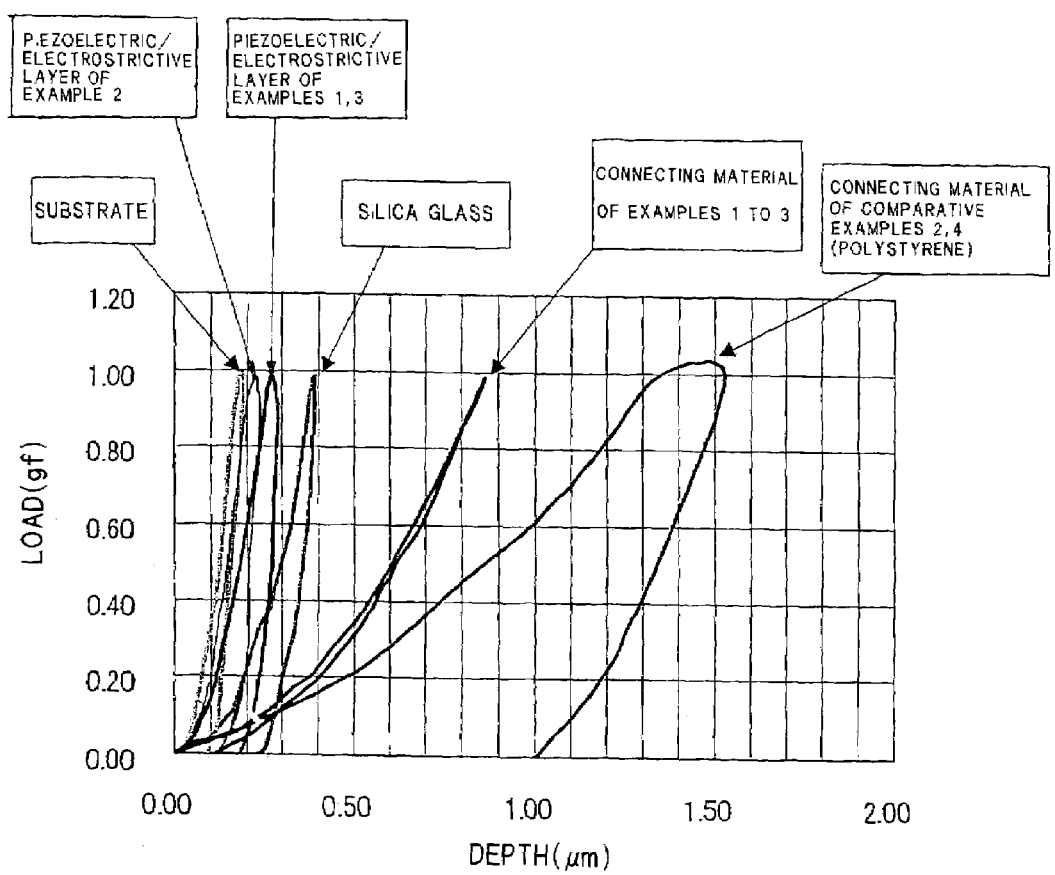
FIG. 16 is a graph showing a result of a Vicars indenter penetration depth in the piezoelectric/electrostrictive film device in each example and comparative example.

For the Vickers indenter penetration depth of the obtained piezoelectric/electrostrictive film device, as shown in FIG. 16, the substrate indicated 0.18 µm, the piezoelectric/electrostrictive layer indicated 0.27 µm, and the coupling member and loosely bound layer indicated 0.87 µm. The coupling member had the maximum thickness in the tip end of the projecting portion of the piezoelectric/electrostrictive layer, the thickness was 5 µm, and the thickness of the loosely bound layer was 0.5 µm.

Comparative Example 1

The piezoelectric/electrostrictive film device was manufactured in the same manner as in Example 1 except that the device was manufactured without being coated with a predetermined coating liquid for the inorganic thin film, and the coupling member and loosely bound layer were not disposed.

For the Vickers indenter penetration depth of each constituting material of the obtained piezoelectric/electrostrictive film device, the substrate indicated 0.18 µm, and the piezoelectric/electrostrictive layer indicated 0.27 µm.

Comparative Example 2

The piezoelectric/electrostrictive film device was manufactured in the same manner as in Example 1 except that the bond material and loosely bound layer of polystyrene were disposed in the device in the same manner as in the device of Example 1.

For the Vickers indenter penetration depth of each constituting material of the obtained piezoelectric/electrostrictive film device, the substrate indicated 0.18 µm, the piezoelectric/electrostrictive layer indicated 0.27 µm, and the coupling member and loosely bound layer indicated 1.5 µm. The coupling member had the maximum thickness in the tip end of the projecting portion of the piezoelectric/electrostrictive layer, the thickness was 10 µm, and the thickness of the loosely bound layer was 1 µm.

Evaluation

For the piezoelectric/electrostrictive film device of Comparative Example 1 in which the predetermined coupling member and loosely bound layer were not disposed, the resonance frequency was 1.6 MHz, and the flexural displacement was 0.14 µm. For the piezoelectric/electrostrictive film device of Comparative Example 2 in which the bond material and loosely bound layer of polystyrene were disposed, the resonance frequency was 1.6 MHz, and the flexural displacement was 0.14 µm.

On the other hand, for the piezoelectric/electrostrictive film device of Example 1 in which the coupling member and loosely bound layer were disposed, the flexural displacement was 0.14 µm in the same manner as in the piezoelectric/electrostrictive film device of Comparative Examples 1, 2. Additionally, the resonance frequency was 1.7 MHz, and higher than that of the piezoelectric/electrostrictive film device of Comparative Examples 1, 2 by 6%.

Example 2

The platinum-made lower electrode (dimension: diameter of 0.7 mm, thickness: 3 µm) was formed on the substrate whose thin portion and fixing portion were both made of $Y_2O_3$-stabilized $ZrO_2$ (dimension of the thin portion: diameter of 1.0 mm, thickness: 10 µm) by the screen printing method. The heat treatment at a temperature of 1300° C. for two hours was carried out to integrate the electrode with the substrate.

Thereon, the piezoelectric material constituted of 0.98 $(Bi_{0.5}Na_{0.5})TiO_3$-0.02$KNbO_3$ (specific surface area of 0.55 $m^2/g$) was layered in a thickness of 32 µm in a broader diameter range of 0.82 mm including the surface corresponding to the upper surface of the lower electrode by the screen printing method.

Subsequently, the atmosphere-controlling material having the same composition as that of the piezoelectric material was placed in the container, and the layered piezoelectric material on the electrode-formed substrate was heat-treated at 1100° C. for three hours. The thickness of the piezoelectric layer after the heat treatment was 20 µm.

Subsequently, the upper electrode formed of gold was formed in a thickness of 0.5 µm in a range of a diameter of 0.74 mm on the piezoelectric layer by the screen printing method, and thereafter heat-treated at 600° C.

Subsequently, the portion of the obtained device on the side opposite to the surface of the substrate in which the piezoelectric/electrostrictive layer and electrode were disposed covered with a UV sheet and fixed onto a sample stage so that the coating liquid did not adhere thereon as a result of being spoiled by run-around coating liquid. 30% by mass of colloidal silica which had the two-peaks particle size distribution and in which large-diameter amorphous silica having an average particle diameter of 100 nm larger than the inflection point of 50 existing between two peaks was mixed with small-diameter amorphous silica having an average particle diameter of 20 nm not more than the inflection point of 50 nm was mixed with 70% by mass of the polymerizable oligomer liquid containing 20% by mass (content in the total amount of the polymerizable oligomer liquid) of the mol mixture of tetraethoxysilane and methylethoxysilane in the mixed dispersing medium of isopropyl alcohol and water to prepare the coating liquid. The whole device was coated by the spin coating method. In this case, the sample stage was rotated first at 500 rpm. Immediately after dropping the coating liquid, the rotation number was increased to 2000 rpm, and the stage was rotated for 30 seconds. Colloidal silica containing large-diameter amorphous silica mixed with small-diameter amorphous silica was prepared by mixing/agitating 70% by mass of colloidal silica (solid concentration 20% by mass) containing large-diameter amorphous silica having an average particle diameter of 100 nm dispersed in isopropyl alcohol with 30% by mass of colloidal silica (solid concentration 20% by mass) containing small-diameter amorphous silica having an average particle diameter of 20 nm dispersed in isopropyl alcohol.

Finally, after stopping the rotation, the device coated with the coating liquid for the inorganic thin film was left to stand at room temperature for 30 minutes. Thereafter, the temperature was raised at a temperature rise speed of 200° C./h, held at 80° C. to 120° C. for one hour, and continuously raised at 300° C. The hardening treatment was performed at the same temperature for 60 minutes to harden the coupling member for coupling the whole projecting portion of the piezoelectric/electrostrictive layer to the substrate and the loosely bound layer with which the upper electrode was coated. Accordingly, the piezoelectric/electrostrictive film device was manufactured.

For the Vickers indenter penetration depth of the obtained piezoelectric/electrostrictive film device, as shown in FIG. 16, the substrate indicated 0.18 µm, the piezoelectric/electrostrictive layer indicated 0.22 µm, and the coupling member and loosely bound layer indicated 0.87 µm. The coupling member had the maximum thickness in the tip end of the projecting portion of the piezoelectric/electrostrictive layer, the thickness was 5 µm, and the thickness of the loosely bound layer was 0.5 µm.

Comparative Example 3

The piezoelectric/electrostrictive film device was manufactured in the same manner as in Example 2 except that the device was manufactured without being coated with the predetermined coating liquid for the inorganic thin film, and the coupling member and loosely bound layer were not disposed.

For the Vickers indenter penetration depth of each constituting material of the obtained piezoelectric/electrostrictive film device, the substrate indicated 0.18 µm, and the piezoelectric/electrostrictive layer indicated 0.22 µm.

Comparative Example 4

The piezoelectric/electrostrictive film device was manufactured in the same manner as in Example 2 except that the bond material and loosely bound layer of polystyrene were disposed in the device in the same manner as in the device of Example 1.

For the Vickers indenter penetration depth of each constituting material of the obtained piezoelectric/electrostrictive film device, the substrate indicated 0.18 µm, the piezoelectric/electrostrictive layer indicated 0.22 µm, and the coupling member and loosely bound layer indicated 1.5 µm. The coupling member had the maximum thickness in the tip end of the projecting portion of the piezoelectric/electrostrictive layer, the thickness was 10 µm, and the thickness of the loosely bound layer was 1 µm.

Evaluation

For the piezoelectric/electrostrictive film device of Comparative Example 3 in which the predetermined coupling member and loosely bound layer were not disposed, the resonance frequency was 1.8 kHz, and the flexural displacement was 0.10 μm. For the piezoelectric/electrostrictive film device of Comparative Example 4 in which the bond material and loosely bound layer of polystyrene were disposed, the resonance frequency was 1.8 kHz, and the flexural displacement was 0.10 μm.

On the other hand, for the piezoelectric/electrostrictive film device of Example 2 in which the coupling member and loosely bound layer were disposed, the flexural displacement was 0.10 μm in the same manner as in the piezoelectric/electrostrictive film device of Comparative Examples 3, 4. Additionally, the resonance frequency was 1.9 kHz, and higher than that of the piezoelectric/electrostrictive film device of Comparative Examples 3, 4 by 6%.

Example 3

The platinum-made lower electrode (dimension: 1.2×0.8 mm, thickness: 3 μm) was formed on a $ZrO_2$ substrate whose $Y_2O_3$-stabilized thin portion was flat (dimension of the thin portion: 1.6×1.1 mm, thickness: 10 μm) by the screen printing method. The heat treatment at a temperature of 1300° C. for two hours was carried out to integrate the electrode with the substrate.

Subsequently, thereon, a first piezoelectric material constituted of $Pb_{1.00}\{(Mg_{0.08}Ni_{0.20})_{1/3}Nb_{2/3}\}_{0.20}Ti_{0.43}Zr_{0.37}O_3$ was layered in dimension of 1.3×0.9 mm, and a thickness of 7 μm by the screen printing method.

Subsequently, thereon, a platinum-made inner electrode (dimension: 1.0×1.1 mm, thickness: 3 μm) was layered by the screen printing method.

Furthermore, thereon, a second piezoelectric material constituted of 98.5% by mass of $Pb_{1.00}(Mg_{1/3}Nb_{2/3})_{0.20}Ti_{0.43}Zr_{0.37}O_3$ and 1.5% by mass of NiO was layered in a dimension of 1.3×0.9 mm, and a thickness of 7 μm by the screen printing method.

Subsequently, the atmosphere-controlling material having the same composition as that of the second piezoelectric material was disposed in the container of 0.15 mg/cm$^3$ in terms of a conversion amount of NiO per atmosphere unit volume, and the layered article was heat-treated at 1275° C. for two hours. The thickness of the piezoelectric/electrostrictive layer after the heat treatment was all 5 μm.

Subsequently, the portion of the obtained device on a side opposite to the surface of the substrate in which the piezoelectric/electrostrictive layer and electrode were disposed covered with a UV sheet and fixed onto a sample stage so that the coating liquid did not adhere thereon as a result of being spoiled by run-around coating liquid. 30% by mass of colloidal silica which had the two-peaks particle size distribution and in which large-diameter amorphous silica having an average particle diameter of 100 nm larger than the inflection point of 50 nm existing between two peaks was mixed with small-diameter amorphous silica having an average particle diameter of 20 nm not more than the inflection point of 50 nm was mixed with 70% by mass of the polymerizable oligomer liquid containing 20% by mass (content in the total amount of the polymerizable oligomer liquid) of the mol mixture of tetraethoxysilane and methylethoxysilane in the mixed dispersing medium of isopropyl alcohol and water to prepare the coating liquid. The whole device was coated by the spin coating method. In this case, the sample stage was rotated first at 500 rpm. Immediately after dropping the coating liquid, the rotation number was increased to 2000 rpm, and the stage was rotated for 30 seconds. Colloidal silica containing large-diameter amorphous silica mixed with small-diameter amorphous silica was prepared by mixing/agitating 70% by mass of colloidal silica (solid concentration 20% by mass) containing large-diameter amorphous silica having an average particle diameter of 100 nm dispersed in isopropyl alcohol with 30% by mass of colloidal silica (solid concentration 20% by mass) containing small-diameter amorphous silica having an average particle diameter of 20 nm dispersed in isopropyl alcohol.

Finally, after stopping the rotation, the device coated with the coating liquid for the inorganic thin film was left to stand at room temperature for 30 minutes. Thereafter, the temperature was raised at a temperature rise speed of 200° C./h, held at 80° C. to 120° C. for one hour, and continuously raised at 300° C. The hardening treatment was performed at the same temperature for 60 minutes to harden the coupling member for coupling the whole projecting portion of the piezoelectric/electrostrictive layer to the substrate and the loosely bound layer with which the upper electrode was coated. Accordingly, the multilayered piezoelectric/electrostrictive film device was manufactured.

For the Vickers indenter penetration depth of the obtained piezoelectric/electrostrictive film device, as shown in FIG. 16, the substrate indicated 0.18 μm, the piezoelectric/electrostrictive layer indicated 0.27 μm, and the coupling member and loosely bound layer indicated 0.87 μm. The coupling member had the maximum thickness in the tip end of the projecting portion of the piezoelectric/electrostrictive layer, the thickness was 5 μm, and the thickness of the loosely bound layer was 0.5 μm.

Comparative Example 5

The piezoelectric/electrostrictive film device was manufactured in the same manner as in Example 3 except that the device was manufactured without being coated with the predetermined coating liquid for the inorganic thin film, and the coupling member and loosely bound layer were not disposed.

For the Vickers indenter penetration depth of each constituting material of the obtained piezoelectric/electrostrictive film device, the substrate indicated 0.18 μm, and the piezoelectric/electrostrictive layer indicated 0.27 μm.

Evaluation

For the piezoelectric/electrostrictive film device of Comparative Example 5 in which the predetermined coupling member and loosely bound layer were not disposed, the resonance frequency was 1.75 MHz, and the flexural displacement was 0.16 μm.

On the other hand, for the piezoelectric/electrostrictive film device of Example 3 in which the coupling member and loosely bound layer were disposed, the flexural displacement was 0.16 μm in the same manner as in the piezoelectric/electrostrictive film device of Comparative Example 5. Additionally, the resonance frequency was 1.85 MHz, and higher than that of the piezoelectric/electrostrictive film device of Comparative Example 3 by 6%.

As described above, according to the present invention, there can be provided the piezoelectric/electrostrictive film device which has the flexural displacement and durability not less than those of a related-art piezoelectric/electrostrictive film device and in which the high resonance frequency is obtained and which is superior in high-speed response.

Moreover, according to the present invention, there can be provided a manufacturing method of the piezoelectric/electrostrictive film device in which the piezoelectric/electrostrictive film device having these superior properties can be manufactured without cracking or damaging each portion.

What is claimed is:

1. A piezoelectric/electrostrictive film device comprising:
a substrate which is formed of ceramic;
a piezoelectric/electrostrictive operation portion including a lower electrode, piezoelectric/electrostrictive layer, and upper electrode which are successively stacked on the substrate and including a projecting end of the piezoelectric/electrostrictive layer with which an upper surface of the lower electrode and a lower surface of the upper electrode are not coated; and
a coupling member extending between said projecting end of the piezoelectric/electrostrictive layer and the substrate and being coupled to the substrate, wherein the coupling member comprises a hybrid material in which silica particles are scattered in a matrix containing a polysiloxane polymer as a main component.

2. The piezoelectric/electrostrictive film device according to claim 1, wherein the polysiloxane polymer is a polysiloxane polymer in which a substituent group is introduced in a part shown in the following general formula (1):

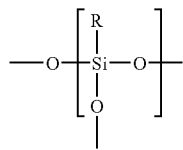

where R is at least one alkyl group selected from a group consisting of a methyl group, ethyl group, and propyl group, an aryl group, an alkenyl group, or at least one substituent alkyl group selected from a group consisting of a γ-methacryloxypropyl group, γ-glycidoxypropyl group, γ-chloropropyl group, γ-mercaptopropyl group, γ-aminopropyl group, and trifluoromethyl group.

3. A piezoelectric/electrostrictive film device comprising:
a substrate which is formed of ceramic;
a piezoelectric/electrostrictive operation portion including a lower electrode, piezoelectric/electrostrictive layer, and upper electrode which are successively stacked on the substrate and including a projecting end of the piezoelectric/electrostrictive layer with which an upper surface of the lower electrode and a lower surface of the upper electrode are not coated; and
a coupling member extending between said projecting end of the piezoelectric/electrostrictive layer and the substrate and being coupled to the substrate, wherein the coupling member comprises a hybrid material in which inorganic particles having an average particle diameter of 5 nm to 1 μm are scattered in a matrix of a polymer compound.

4. The piezoelectic/electrostrictive film device according to claim 3, wherein the inorganic particles have a two-peaks particle size distribution, and a ratio (D/C) of an average particle diameter (C) of large-diameter inorganic particles having a particle diameter larger than that corresponding to a inflection point existing between two peaks to an average particle diameter (D) of small-diameter inorganic particles having a particle diameter not more than that corresponding to the inflection point is in a range of 0.05 to 0.7.

5. A piezoelectric/electrostrictive film device comprising:
a substrate which is formed of ceramic;
a piezoelectric/electrostrictive operation portion including a plurality of electrodes and a plurality of piezoelectric/electrostrictive layers which are alternately stacked on the substrate and including a projecting end of each piezoelectic/electrostrictive layer with which upper and lower surfaces of each electrode are not coated; and
a coupling member extending between said projecting end of the piezoelectric/electrostrictive layer and the substrate and being coupled to the substrate, wherein the coupling member comprises a hybrid material in which silica particles are scattered in a matrix containing a polysiloxane polymer as a main component, and the electrodes are disposed in uppermost and lowermost layers in a multilayered structure of the piezoelectric/electrostrictive layers and electrodes.

6. The piezoelectric/electrostrictive film device according to claim 5, wherein the polysiloxane polymer is a polysiloxane polymer in which a substituent group is introduced in a part shown in the following general formula (1):

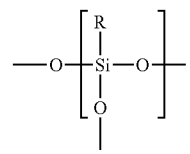

where R is at least one alkyl group selected from a group consisting of a methyl group, ethyl group, and propyl group, an aryl group, an alkenyl group, or at least one substituent alkyl group selected from a group consisting of a γ-methacryloxypropyl group, γ-glycidoxypropyl group, γ-chloropropyl group, γ-mercaptopropyl group, γ-aminopropyl group, and trifluoromethyl group.

7. A piezoelectric/electrostrictive film device comprising:
a substrate which is formed of ceramic;
a piezoelectric/electrostrictive operation portion including a plurality of electrodes and a plurality of piezoelectric/electrostrictive layers which are alternately stacked on the substrate and including a projecting end of each piezoelectric/electrostrictive layer with which upper and lower surfaces of each electrode are not coated; and
a coupling member extending between said projecting end of the piezoelectric/electrostrictive layer and the substrate and being coupled to the substrate, wherein the coupling member comprises a hybrid material in which inorganic particles having an average particle diameter of 5 nm to 1 μm are scattered in a matrix of a polymer compound, and the electrodes are disposed in uppermost and lowermost layers in a multilayered structure of the piezoelectric/electrostrictive layers and electrodes.

8. The piezoelectric/electrostrictive film device according to claim 7, wherein the inorganic particles have a two-peaks particle size distribution, and a ratio (D/C) of an average particle diameter (C) of large-diameter inorganic particles having a particle diameter larger than that corresponding to a inflection point existing between two peaks to an average particle diameter (D) of small-diameter inorganic particles having a particle diameter not more than that corresponding to the inflection point is in a range of 0.05 to 0.7.

* * * * *